(12) United States Patent
Deguchi et al.

(10) Patent No.: US 10,957,403 B2
(45) Date of Patent: Mar. 23, 2021

(54) SEMICONDUCTOR DEVICE INCLUDING A VOLTAGE GENERATION CIRCUIT CONFIGURED WITH FIRST AND SECOND CURRENT CIRCUITS FOR INCREASING VOLTAGES OF FIRST, SECOND, AND THIRD OUTPUT NODES

(71) Applicant: Toshiba Memory Corporation, Tokyo (JP)

(72) Inventors: Yoko Deguchi, Yokohama Kanagawa (JP); Masahiro Yoshihara, Yokohama Kanagawa (JP); Yoshihiko Kamata, Yokohama Kanagawa (JP); Takuyo Kodama, Sagamihara Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/549,395

(22) Filed: Aug. 23, 2019

(65) Prior Publication Data

US 2020/0202956 A1     Jun. 25, 2020

(30) Foreign Application Priority Data

Dec. 25, 2018   (JP) .............................. JP2018-241538

(51) Int. Cl.
| | |
|---|---|
| *G11C 16/30* | (2006.01) |
| *G11C 16/04* | (2006.01) |
| *G11C 16/24* | (2006.01) |
| *G11C 16/26* | (2006.01) |

(52) U.S. Cl.
CPC .......... *G11C 16/30* (2013.01); *G11C 16/0483* (2013.01); *G11C 16/24* (2013.01); *G11C 16/26* (2013.01)

(58) Field of Classification Search
CPC ..... G11C 16/30; G11C 16/0483; G11C 16/24; G11C 16/26; G11C 16/32; G11C 11/5642
See application file for complete search history.

(56) References Cited

U.S. PATENT DOCUMENTS

| | | | |
|---|---|---|---|
| 7,453,742 B2 | 11/2008 | Maejima et al. | |
| 8,248,862 B2 | 8/2012 | Di Iorio et al. | |
| 8,509,019 B2 | 8/2013 | Noh | |
| 10,210,924 B2 * | 2/2019 | Kamata | ................. G11C 11/406 |
| 10,217,519 B2 | 2/2019 | Minagawa et al. | |

(Continued)

FOREIGN PATENT DOCUMENTS

| | | |
|---|---|---|
| TW | 200807429 A | 2/2008 |
| TW | 200912587 A | 3/2009 |
| TW | 201814715 A | 4/2018 |

*Primary Examiner* — Mushfique Siddique
(74) *Attorney, Agent, or Firm* — Kim & Stewart LLP

(57) ABSTRACT

A semiconductor device includes a first current circuit, a first resistor, a second resistor, a second current circuit, and a third resistor. The first current circuit is configured to output a first current to a first node using a first voltage supplied thereto. The first resistor is connected to the first node. The second resistor has a first end connected to a second node that is at a same voltage level as the first node and a second end. The second current circuit is configured to output a second current to a third node using a second voltage, which is higher than the first voltage, supplied thereto. The third resistor is connected between the second end of the second resistor and the third node.

17 Claims, 12 Drawing Sheets

(56) References Cited

U.S. PATENT DOCUMENTS

| | | |
|---|---|---|
| 2006/0233278 A1 | 10/2006 | Zerbe et al. |
| 2007/0200616 A1 | 8/2007 | Shin |
| 2008/0018318 A1 | 1/2008 | Hsu |
| 2009/0058512 A1 | 3/2009 | Huang |
| 2009/0161436 A1* | 6/2009 | Abiko .................... G11C 16/30 365/185.17 |
| 2013/0279255 A1* | 10/2013 | Kamata .................. G11C 16/26 365/185.11 |
| 2016/0189777 A1* | 6/2016 | Yoshihara .............. G11C 16/26 365/185.17 |

* cited by examiner

SEMICONDUCTOR DEVICE INCLUDING A VOLTAGE GENERATION CIRCUIT CONFIGURED WITH FIRST AND SECOND CURRENT CIRCUITS FOR INCREASING VOLTAGES OF FIRST, SECOND, AND THIRD OUTPUT NODES

CROSS-REFERENCE TO RELATED APPLICATION

This application is based upon and claims the benefit of priority from Japanese Patent Application No. 2018-241538, filed Dec. 25, 2018, the entire contents of which are incorporated herein by reference.

FIELD

Embodiments described herein relate generally to a semiconductor device.

BACKGROUND

Semiconductor storage devices that store data in a nonvolatile manner are known. Such semiconductor storage devices include a sense amplifier and a voltage generation circuit that generates control voltages for the sense amplifier. The voltage generation circuit includes a current circuit that outputs a current and different control voltages for the sense amplifier are generated based on several factors including the magnitude of the current.

The sense amplifier includes some transistors that require higher control voltages and the current circuit uses a high power source voltage to generate the higher control voltages. However, higher control voltages take longer to stabilize. Therefore, it would be desirable to provide a voltage generation circuit that can reduce the time for the higher control voltages to stabilize.

SUMMARY

Figure 1:
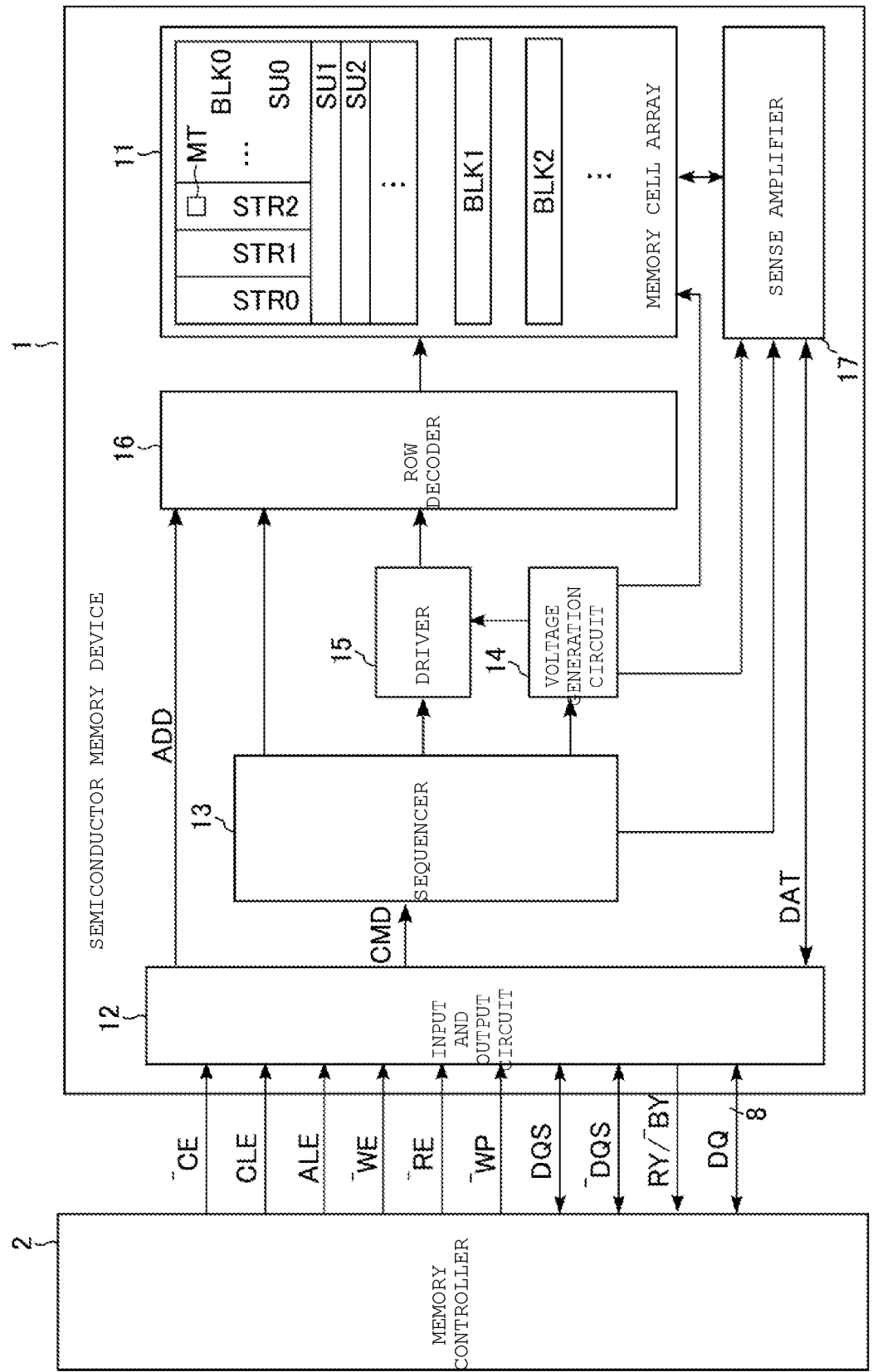
FIG. 1 shows a functional block of a semiconductor memory device and related elements of a first embodiment.

In general, according to one embodiment, a semiconductor device includes a first current circuit, a first resistor, a second resistor, a second current circuit, and a third resistor. The first current circuit is configured to output a first current to a first node using a first voltage supplied thereto. The first resistor is connected to the first node. The second resistor has a first end connected to a second node that is at a same voltage level as the first node and a second end. The second current circuit is configured to output a second current to a third node using a second voltage, which is higher than the first voltage, supplied thereto. The third resistor is connected between the second end of the second resistor and the third node.

DETAILED DESCRIPTION

Embodiments will be described below with reference to the drawings. In the following description, components having substantially the same functions and configurations are given the same reference numerals, and repeated descriptions may be omitted. The drawings are schematic. All descriptions of one embodiment also apply to descriptions of other embodiments, unless explicitly or explicitly excluded.

Each functional block described herein may be implemented as hardware, computer software, or a combination of both. For this reason, it is generally described in terms of their functions so that it is clear that each functional block may be any of these. In addition, functions performed by functional blocks as described herein may be performed by different functional blocks.

In the present specification and claims, a first element "connected to" another second element means that the first element is directly connected to the second element or via a conductive element or a switch that is turned on or off to selectively provide a conductive path between the first and second elements.

First Embodiment 1.1. Configuration (Structure)

FIG. 1 shows a functional block and related elements of a semiconductor memory device 1 of a first embodiment. The semiconductor memory device 1 shown in FIG. 1 is controlled by a memory controller 2. The semiconductor memory device 1 includes elements such as a memory cell array 11, an input and output circuit 12, a sequencer (also referred to as a control circuit) 13, a voltage generation circuit 14, a driver 15, a row decoder 16, and a sense amplifier 17.

The memory cell array 11 includes a plurality of memory blocks BLKs (BLK0, BLK1, . . . ). Data in each block BLK is erased collectively. Alternatively, data may be erased in units smaller than one block BLK, for example, half of one block. Each block BLK is a set of a plurality of string units SUs (SU0, SU1, . . . ). Each string unit SU is a set of a plurality of NAND strings STRs (STR0, STR1, . . . ). Each string STR includes a plurality of memory cell transistors MT.

The memory cell array 11 further includes various wirings (not shown). The various wirings include a source line CELSRC, word lines WL, and bit lines BL.

The input and output circuit 12 is connected to the memory controller 2 via a NAND bus. The NAND bus carries signals ⎯CE, CLE, ALE, ⎯WE, ⎯RE, ⎯WP, RY/⎯BY, and a signal DQ having a width of 8 bits. The symbol "—" in front of the name of signals indicates inverted logic of the signal without the symbol and indicates that it is asserted when the signal with the symbol "—" is at a low level.

The input and output circuit 12 is able to both receive the signal DQ and output the signal DQ. The input and output circuit 12 receives various control signals from the memory controller 2, and receives or outputs the signal DQ based on the control signals. The control signals include the signals —CE, CLE, ALE, —WE, —RE, and —WP.

The signal DQ includes a command (CMD), write data or read data (DAT), an address signal (ADD), status data (STA), and the like.

The asserted signal —CE enables the semiconductor memory device 1. The asserted signal CLE notifies the semiconductor memory device 1 that the signal DQ input to the semiconductor memory device 1 in parallel with the signal CLE is the command CMD. The asserted signal ALE notifies the semiconductor memory device 1 that the signal DQ input to the semiconductor memory device 1 in parallel with the signal ALE is the address signal ADD. The asserted signal —WE instructs the semiconductor memory device 1 to receive the signal DQ sent to the semiconductor memory device 1 in parallel with the signal —WE. The asserted signal —RE instructs the semiconductor memory device 1 to output the read data through the signal DQ. The asserted signal —WP instructs the semiconductor memory device 1 to inhibit data writing and erasing. The signal RY/—BY indicates whether the semiconductor memory device 1 is in a ready state or a busy state, and indicates the busy state at a low level. The semiconductor memory device 1 is able to accept an instruction from the memory controller 2 in the ready state, and is not able to accept an instruction from the memory controller 2 in the busy state.

The signals DQS and —DQS from the memory controller 2 to the semiconductor memory device 1 instruct a timing at which the signal DQ is output from the memory controller 2 to the semiconductor memory device 1. The signals DQS and —DQS from the semiconductor memory device 1 to the memory controller 2 notify the timing at which the signal DQ is output from the semiconductor memory device 1 to the memory controller 2.

The sequencer 13 receives the command CMD and the address signal ADD from the input and output circuit 12, controls the driver 15, the sense amplifier 17, and the row decoder 16 based on the command CMD and the address signal ADD.

The voltage generation circuit 14 receives a power source voltage from outside the semiconductor memory device 1, and generates various voltages based on the power source voltage. The generated voltages are supplied to elements such as the memory cell array 11, the driver 15, and the sense amplifier 17. The driver 15 receives a plurality of voltages from the voltage generation circuit 14, and supplies one selected from the plurality of voltages to the row decoder 16.

The row decoder 16 receives the various voltages from the driver 15, receives the address signal ADD from the input and output circuit 12, selects one block BLK based on the received address signal ADD, and transmits the voltage from the driver 15 to the selected block BLK.

The sense amplifier 17 senses a state of a memory cell transistor MT, and generates read data DAT or transmits write data DAT to the memory cell transistor MT based on the sensed state. The sense amplifier 17 receives the various voltages from the voltage generation circuit 14, and controls the voltages of the bit lines.

1.1.1. Cell Array

Figure 2:
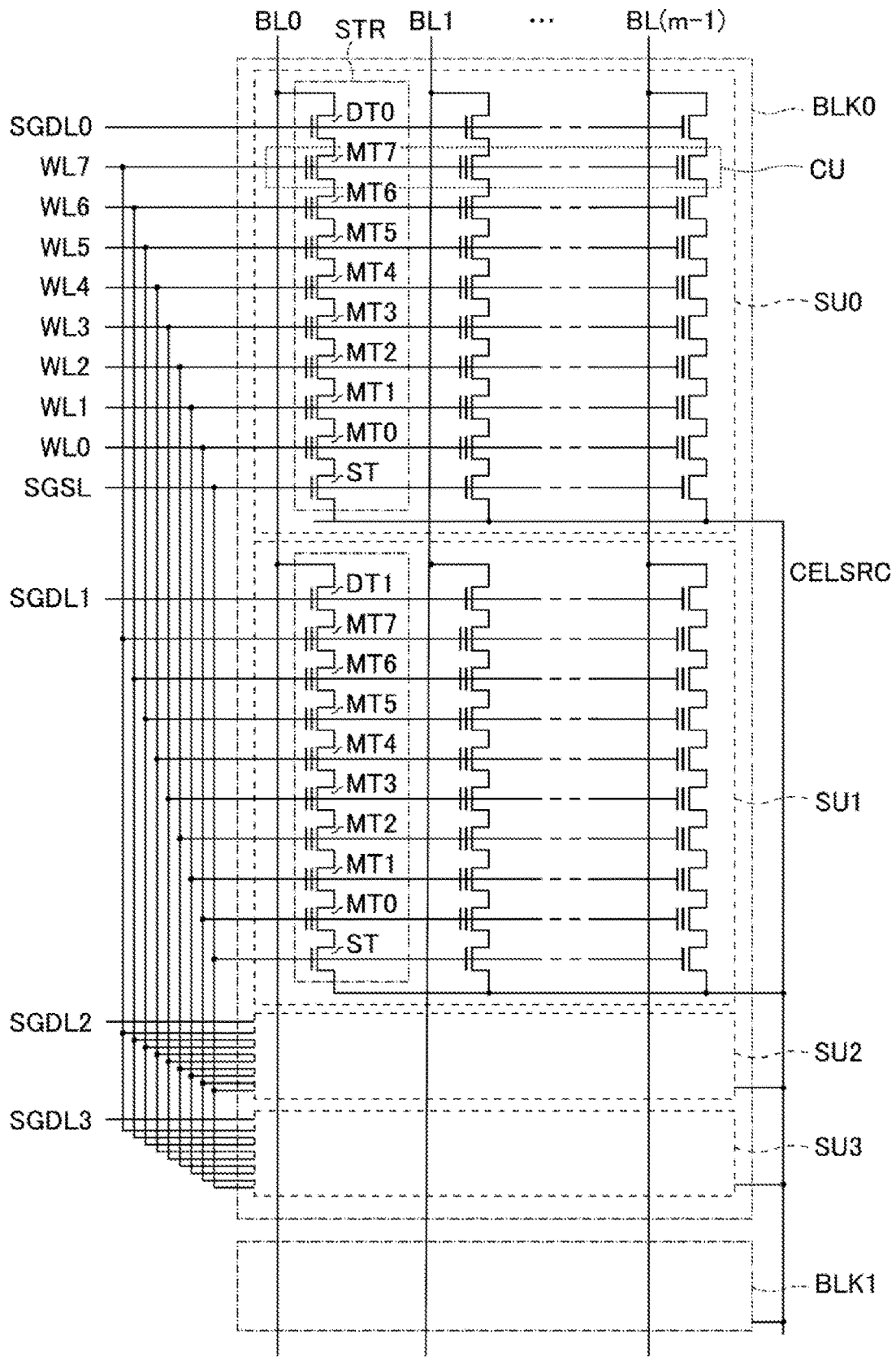
FIG. 2 shows the elements and connections of one block and related elements of the first embodiment.

FIG. 2 shows an example of elements and connections in the memory cell array 11 of the first embodiment, and shows elements and connections of one block BLK0 and related elements. All of a plurality of (for example, all) blocks BLK include elements and connections shown in FIG. 2.

One block BLK includes a plurality of (for example, four) string units SU0 to SU3. The following description is based on an example in which one block BLK includes four string units SU0 to SU3.

Each of the bit lines BL0 to BL(m-1) of m (m is a natural number) is connected to one string STR from each of string units SU0 to SU3 in each block BLK.

Each string STR includes one select gate transistor ST, a plurality of (for example, eight) memory cell transistors MT (MT0 to MT7), and one select gate transistor DT (DT0, DT1, DT2, or DT3). Transistors ST, MT, and DT are connected in series in this order between the source wiring CELSRC and one bit line BL. The memory cell transistor MT includes a control gate electrode and a charge storage layer, which can store data in a non-volatile manner based on the amount of charge stored in the charge storage layer.

A plurality of strings STR connected respectively to a plurality of bit lines BL which are different from each other make up one string unit SU. In each string unit SU, control gate electrodes of the memory cell transistors MT0 to MT7 are connected to word lines WL0 to WL7, respectively. In each block BLK, the word lines WL with the same address in different string units SU are connected to each other. A set of the memory cell transistors MT which share the word lines WL, in one string unit SU, is referred to as a cell unit CU.

The transistors DT0 to DT3 are provided in the string units SU0 to SU3, respectively. In a case of each of α=0 to 3, the gate of each transistor DTα of the plurality of strings STR in the string unit SUα is connected to a select gate line SGDLα. The gate of the transistor ST is connected to the select gate line SGSL.

1.1.2. Memory Cell Transistor

Figure 3:
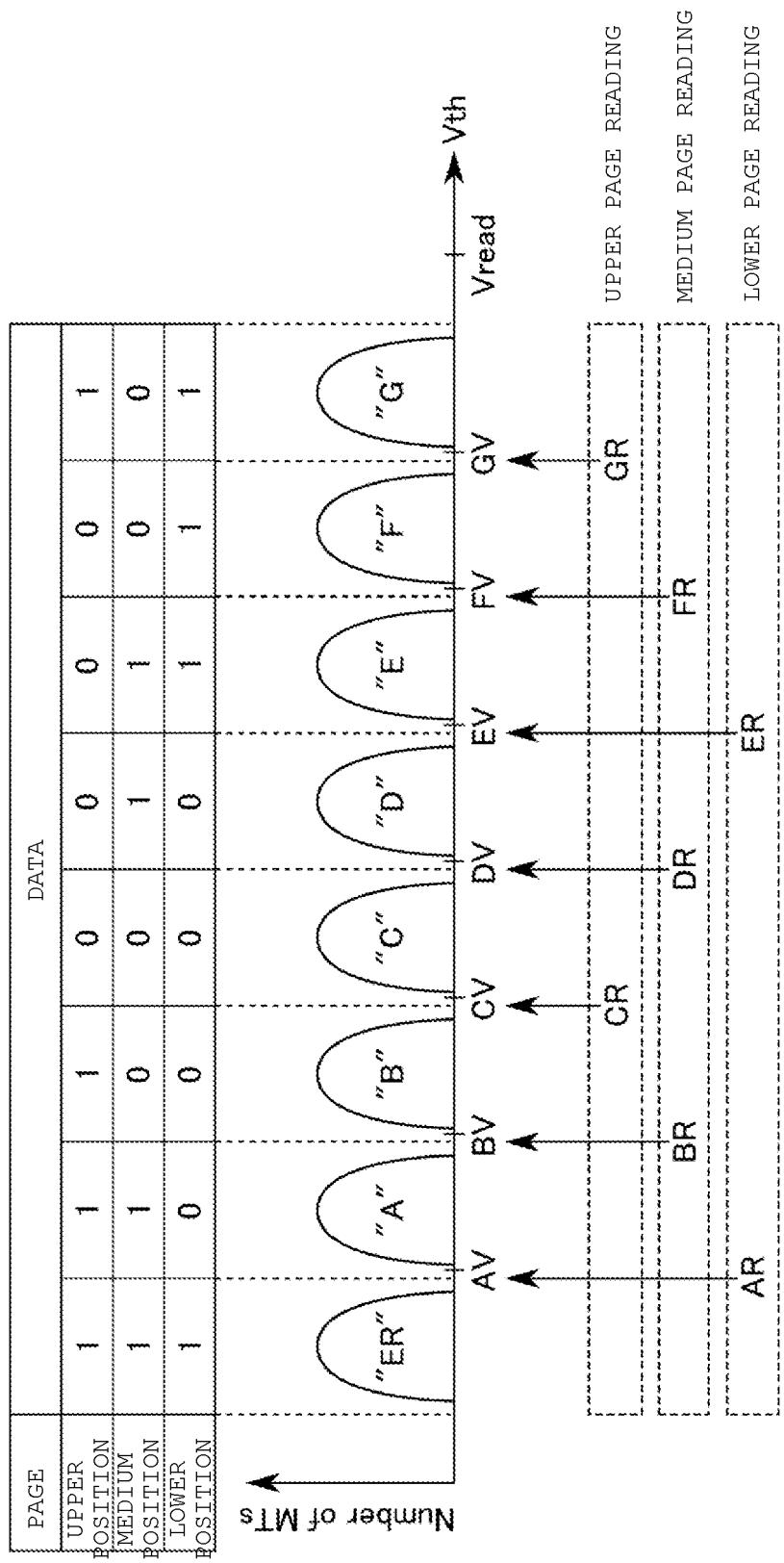
FIG. 3 shows the distribution of threshold voltages of a memory cell transistor as a result of writing in the first embodiment.

The semiconductor memory device 1 can store data more than two bits in one memory cell transistor MT. FIG. 3 shows distribution of a threshold voltage of the memory cell transistor MT which stores three bits of data per one memory cell transistor MT as a result of writing. The threshold voltage of each memory cell transistor MT is in a range corresponding to stored data among a plurality of ranges. In the case of three-bit storage per the memory cell transistor MT, each memory cell transistor MT may have any of eight threshold voltages. The eight threshold voltages are in states which represent each of "111" data, "110" data, "100" data, "000" data, "010" data, "011" data, "001" data, and "101" data, respectively. The memory cell transistors MT having states which represent each of "111" data, "110" data, "100" data, "000" data, "010" data, "011" data, "001" data, and "101" data, respectively, are referred to as being in Er, A, B, C, D, E, F, and G states, respectively.

A plurality of the memory cell transistors MT written to store the same three-bit data may have threshold voltages that are slightly different from each other, and thus the threshold voltages are distributed.

In order to determine the data stored by a read target memory cell transistor MT, the state of the memory cell transistor MT is determined. In order to determine the state, read voltages VA, VB, VC, VD, VE, VF, and VG are used. Hereinafter, a voltage of a certain magnitude applied to the read target memory cell transistor MT for determining the state, including the read voltages VA, VB, VC, VD, VE, VF, and VG, may be referred to as a read voltage VCGR.

Whether or not the threshold voltage of the read target memory cell transistor MT exceeds a certain read voltage VCGR is used to determine the state of the threshold voltage of the memory cell transistor MT. A voltage VREAD is applied to the word line WL of a non-read target memory cell transistor MT of the cell unit CU, and is higher than the threshold voltage of the memory cell transistor MT in any state.

A set of data of bits at the same bit position of the memory cell transistor MT of one cell unit CU configures one page.

It is also possible to store data more than four bits by one memory cell transistor MT according to an extension of the principle described so far.

1.1.3. Sense Amplifier

Figure 4:
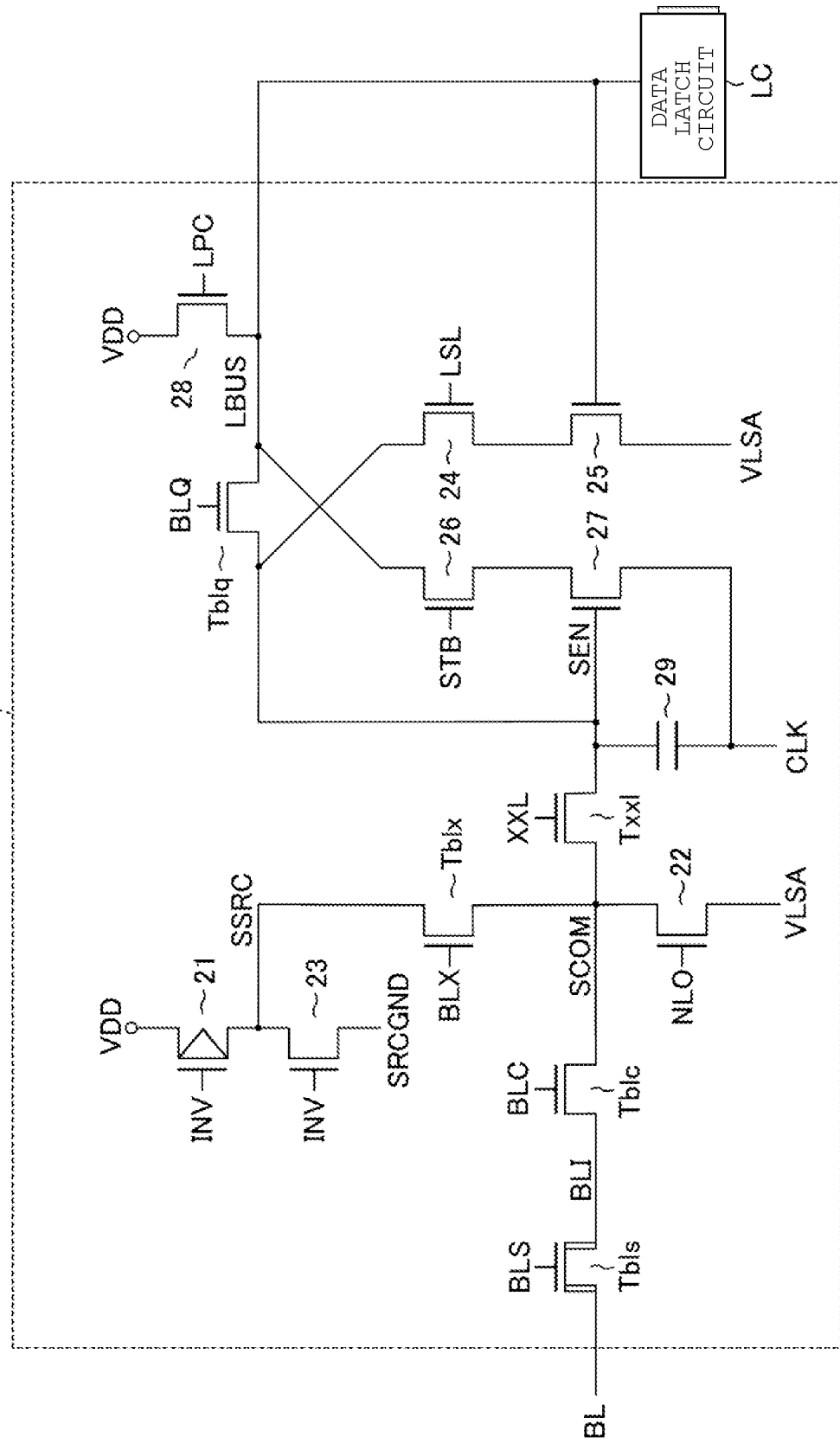
FIG. 4 is a circuit diagram of a part of a sense amplifier of the first embodiment.

FIG. 4 is a circuit diagram of a part of the sense amplifier 17 of the first embodiment. The sense amplifier 17 includes a plurality of the sense amplifier circuits SAC and a plurality of data latch circuits LC. The number of such sense amplifier circuits SAC is the same as the number of bit lines BL. FIG. 4 shows an example of one sense amplifier circuit SAC. Each sense amplifier circuit SAC is connected to one bit line BL, and one data latch circuit LC. Each data latch circuit LC may include a plurality of data latches.

Each sense amplifier circuit SAC includes a p-type MOSFET (metal oxide semiconductor field effect transistor) 21, n-type MOSFETs Tbls, Tblc, Tblx, Txxl, Tblq, 22, 23, 24, 25, 26, 27, and 28, and a capacitor 29.

One bit line BL is connected to the sense amplifier circuit SAC. The bit line BL is connected to a node BLI via the transistor Tbls. For example, a gate of the transistor Tbls is connected to a node BLS in the voltage generation circuit 14.

The node BLI is connected to a node SCOM via the transistor Tblc. For example, a gate of the transistor Tblc is connected to a node BLC in the voltage generation circuit 14.

The node SCOM is connected to a node VLSA via the transistor 22. For example, a gate of the transistor 22 receives a signal NLO from the sequencer 13.

Furthermore, the node SCOM is connected to a node SSRC via the transistor Tblx. For example, the transistor Tblx is connected to a node BLX in the voltage generation circuit 14.

The node SSRC is connected to a node VDD via the transistor 21, and is connected to a node SRCGND via the transistor 23. The node VDD receives the power source voltage of the sense amplifier 17, and the node SRCGND receives a ground voltage. Each gate of the transistors 21 and 23 is connected to a node INV. The node INV is a node in the data latch circuit LC connected to the sense amplifier circuit SAC shown in FIG. 4.

Furthermore, the node SCOM is connected to a node SEN via the transistor Txxl. For example, a gate of the transistor Txxl is connected to a node XXL in the voltage generation circuit 14.

The node SEN is connected to a data bus LBUS via the transistor Tblq. For example, a gate of the transistor Tblq is connected to a node BLQ in the voltage generation circuit 14. The data bus LBUS is connected to the data latch circuit LC corresponding to the sense amplifier circuit SAC shown in FIG. 4.

Also, the node SEN is connected to a first end (one of source and drain) of the transistor 24. For example, a gate of the transistor 24 receives a signal LSL from the voltage generation circuit 14 and is connected to the node VLSA via the transistor 25 at its second end (the other of source and drain). A gate of the transistor 25 is connected to the data bus LBUS.

Furthermore, the data bus LBUS is connected to a first end of the transistor 27 via the transistor 26. For example, a gate of the transistor 26 receives a signal STB from the sequencer 13, and a second end thereof is connected to the first end of the transistor 27. A gate of the transistor 27 is connected to the node SEN, and a second end thereof is connected to a node CLK. Furthermore, the node CLK is connected to the node SEN via the capacitor 29.

The transistor 28 is connected between the node VDD and the data bus LBUS, and a gate thereof, for example, receives a signal LPC from the sequencer 13.

1.1.4. Voltage Generation Circuit

Figure 5:
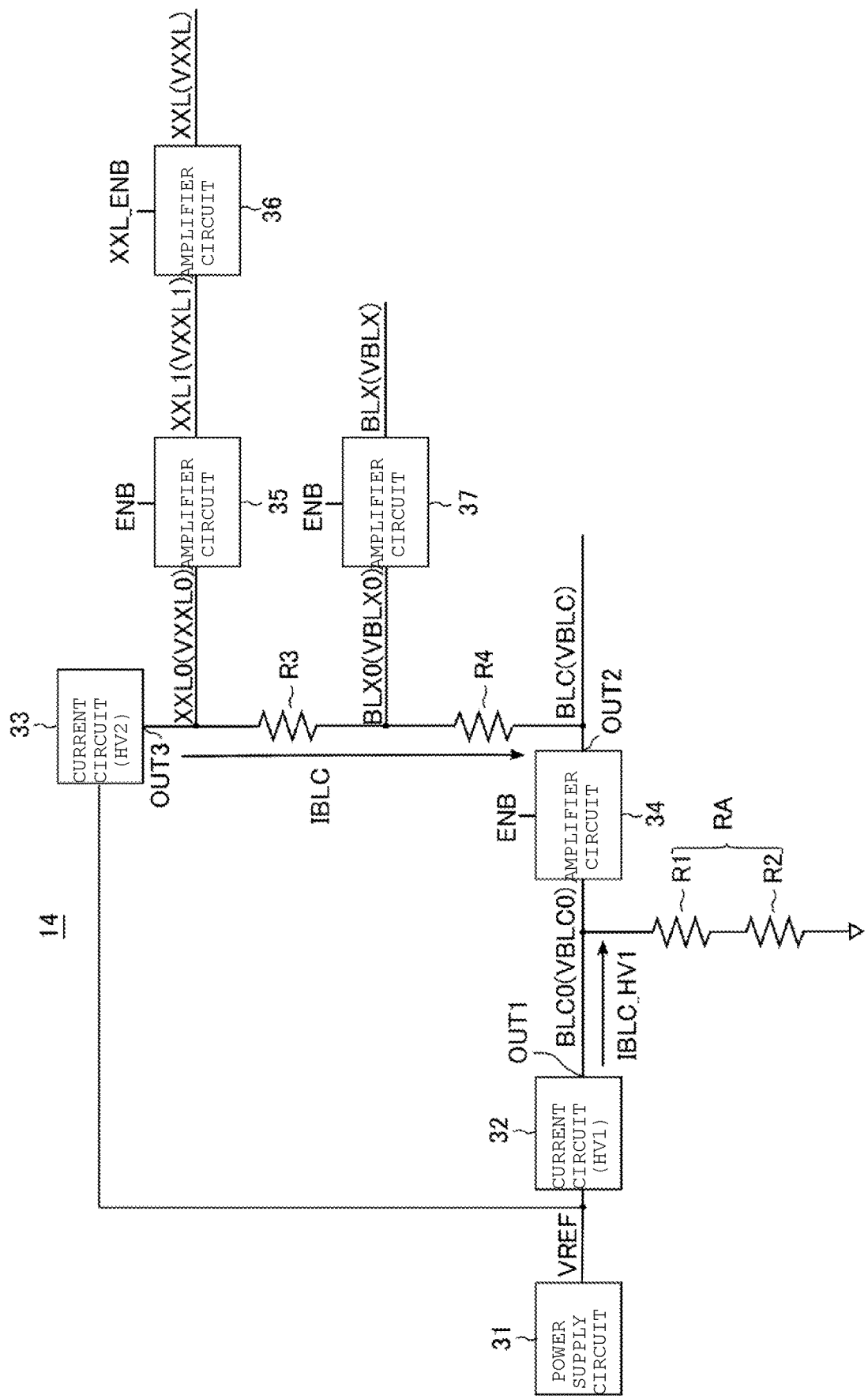
FIG. 5 shows a functional block of a voltage generation circuit of the first embodiment.

FIG. 5 shows a functional block of the voltage generation circuit 14 of the first embodiment.

As shown in FIG. 5, the voltage generation circuit 14 includes a power supply circuit 31, current circuits 32 and 33, amplifier circuits 34, 35, 36, and 37, and resistors R1, R2, R3, and R4.

For example, the power supply circuit 31 generates a reference voltage VREF from an internal power source voltage VCC. For example, the internal power source voltage VCC is based on a power source voltage supplied from outside the semiconductor memory device 1.

The current circuit 32 includes a power supply circuit GHV1 (not shown) that generates a power source voltage HV1. For example, the power supply circuit GHV1 generates the power source voltage HV1 from the internal power source voltage VCC. The power source voltage HV1 is higher than the internal power source voltage VCC. Also, the current circuit 32 receives the reference voltage VREF.

The current circuit 32 generates a current IBLC_HV1 by using the power source voltage HV1 and the reference voltage VREF, and outputs the current IBLC_HV1 at an output node OUT1 thereof. The current circuit 32 outputs the current IBLC_HV1 of a certain magnitude (level) when the power source voltage HV1 is in a stable state. The output node OUT1 of the current circuit 32 is connected to the node BLC0.

The node BLC0 is connected to a node (or ground) at a common voltage VSS via the resistors R1 and R2 connected in series. Accordingly, at the node BLC0, a voltage VBLC0 of a magnitude equal to the product of the current IBLC_HV1 and a combined resistance of the resistors R1 and R2 (also referred to as resistor RA), is generated.

It is desirable that the voltage VBLC0, particularly, the voltage VBLC0 in the stable state of the voltage VBLC0 is at its intended (target) magnitude with high accuracy. The voltage VBLC0 depends on the magnitude of the current IBLC_HV1 and the resistance of the resistor RA, and when the resistor RA has the intended (designed) resistance and the current IBLC_HV1 has the intended magnitude, the voltage VBLC0 of the intended magnitude is obtained. However, the resistors R1 and R2 may have a size slightly different from intended size due to variations in the manufacturing process. As a result, it may be that the voltage VBLC0 is not at the desired magnitude.

To cope with this, the current circuit 32 is configured to obtain the voltage VBLC0 of a magnitude substantially equal to the intended magnitude by generating the current IBLC_HV1 of a magnitude dependent on the resistance of the resistor RA. That is, the current circuit 32 outputs the current IBLC_HV1 greater than the standard when the resistance of the resistor RA is smaller than the intended resistance, and outputs the current IBLC_HV1 smaller than the standard when the resistor RA has greater than the intended resistance. As a result, even if the resistor RA has a resistance different from the intended resistance, the voltage VBLC0 of the intended magnitude is substantially obtained.

An example of the current circuit 32 configured to generate the current IBLC_HV1 of a magnitude dependent on the resistance of the resistor RA will be described below.

The node BLC0 is connected to an input of the amplifier circuit 34. For example, the amplifier circuit 34 is enabled while receiving, for example, the enable signal ENB asserted from the sequencer 13, and outputs a voltage that is equal to the voltage VBLC0 at an output node OUT2. The output node OUT2 is connected to the node BLC. The amplifier circuit 34 has an amplification factor of one, is not used to change the input voltage VBLC0 on the output node OUT2, and, for example, is used to stabilize the operation of the voltage generation circuit 14 or the like. For this reason, it is possible to omit the amplifier circuit 34.

As described above, the voltage VBLC0 has a substantially intended magnitude, a voltage VBLC on the node BLC is equal to the voltage VBLC0. Accordingly, the voltage VBLC is also substantially equal to the intended magnitude.

A current circuit 33 includes a power supply circuit GHV2 (not shown) that generates a power source voltage HV2. For example, the power supply circuit GHV2 generates the power source voltage HV2 from the internal power source voltage VCC. The power source voltage HV2 is higher than the power source voltage HV1. Also, the current circuit 33 receives the reference voltage VREF.

The current circuit 33 generates a current IBLC by using the power source voltage HV2 and the reference voltage VREF, and outputs the current IBLC at an output node OUT3 thereof. The current circuit 33 outputs the current IBLC of a certain magnitude when the power source voltage HV2 is in a stable state. The output node OUT3 is connected to the node XXL0. The node XXL0 is connected to the node BLX0 via the resistor R3. The node BLX0 is connected to the node BLC (output node OUT2 of amplifier circuit 34) via the resistor R4.

The node XXL0 has a voltage equal to a voltage obtained by adding the voltage VBLC to the product of the current IBLC and the combined resistance of resistors R3 and R4. The node XXL0 is connected to an input of the amplifier circuit 35. For example, the amplifier circuit 35 is enabled while receiving the asserted enable signal ENB, generates a voltage VXXL1 by amplifying a voltage VXXL0 on the node XXL0 while being enabled, and outputs the voltage VXXL1 at an output node XXL1. For example, the voltage VXXL1 is equal to the voltage on the node XXL0.

The node XXL1 is connected to an input of the amplifier circuit 36. For example, the amplifier circuit 36 is enabled while receiving a control signal XXL_ENB asserted from the sequencer 13, and outputs the voltage VXXL1 as a voltage VXXL at an output node XXL while being enabled.

The node BLX0 has a voltage equal to a magnitude obtained by adding the product of the current IBLC and the resistor R4 to the voltage VBLC. Since an intended level for the voltage VBLX0 is larger than that of the voltage VBLC, the voltage VBLX0 is generated by the current circuit 33 using the power source voltage HV2. In addition, since an intended level for the voltage VXXL0 is even larger, the voltage VXXL0 is also generated by the current circuit 33 using the power source voltage HV2.

Also, the node BLX0 is connected to an input of an amplifier circuit 37. For example, the amplifier circuit is enabled while receiving the asserted enable signal ENB, generates a voltage VBLX by amplifying voltage VBLX0 on the node BLX0 while being enabled, and outputs the voltage VBLX at an output node BLX. For example, the voltage VBLX is equal to the voltage VBLX0.

It is desirable that the voltages VXXL0 and VBLX0 have the intended magnitude with high accuracy when the voltages VXXL0 and VBLX0 are in a stable state. However, the voltage VXXL0 depends on the magnitudes of the voltage VBLC and the current IBLC and the resistance of the resistors R3 and R4, and the voltage VBLX0 depends on the magnitudes of the voltage VBLC and the current IBLC and the resistance of the resistor R4. Here, since the voltage VBLC has the intended magnitude with high accuracy, the accuracy of the voltages VXXL0 and VBLX0 depends on the accuracy of the magnitude of the current IBLC and the resistance of the resistors R3 and R4. When the resistors R3 and R4 have the intended magnitude and the current IBLC has the intended magnitude, the voltage VBLX0 of the intended magnitude and the voltage VXXL0 of the intended magnitude are obtained. However, the resistors R3 and R4 may have resistance slightly different from intended resistance due to variations in a manufacturing process. As a result, the magnitude of the voltage VBLX0 or the magnitudes of the voltages VBLX0 and VXXL0 may not have the intended magnitude.

To cope with this, the current circuit 33 is configured to obtain the voltages VBLX0 and VXXL0 of the magnitude substantially equal to the intended magnitude by generating the current IBLC of the magnitude dependent on the resistance of the resistors R3 and R4. That is, the current circuit 33 outputs the current IBLC greater than standard when the resistance of the resistor R3 or R4 is smaller than the intended resistance, and outputs the current IBLC smaller than the standard when the resistance of the resistor R3 or R4 is greater than the intended resistance. As a result, even if the resistors R3 and R4 have the resistance different from the intended resistance, the voltages VBLX0 and VXXL0 of the intended magnitude are substantially obtained.

An example of the current circuit 33 configured to generate the current IBLC of the magnitude dependent on the resistance of the resistor R1 will be described below.

As described above, the resistor R4 is connected to the output node OUT2 of the amplifier circuit 34. Accordingly, the current IBLC is input from the output node OUT2 to the amplifier circuit 34. When the amplifier circuit 34 cannot flow the current IBLC to a node of the common voltage, the magnitudes of the voltage VBLC and the voltages VBLX0 and VXXL0 increase unintentionally. To cope with this, the amplifier circuit 34 can flow the current IBLC to a common voltage node. As a specific example, the amplifier circuit 34 includes a transistor having an ability to flow the current IBLC between the output node OUT2 and the common voltage node. A path from the output node OUT2 of the amplifier circuit 34 to the common voltage node functions as a discharge path for the output of the current circuit 33.

Figure 6:
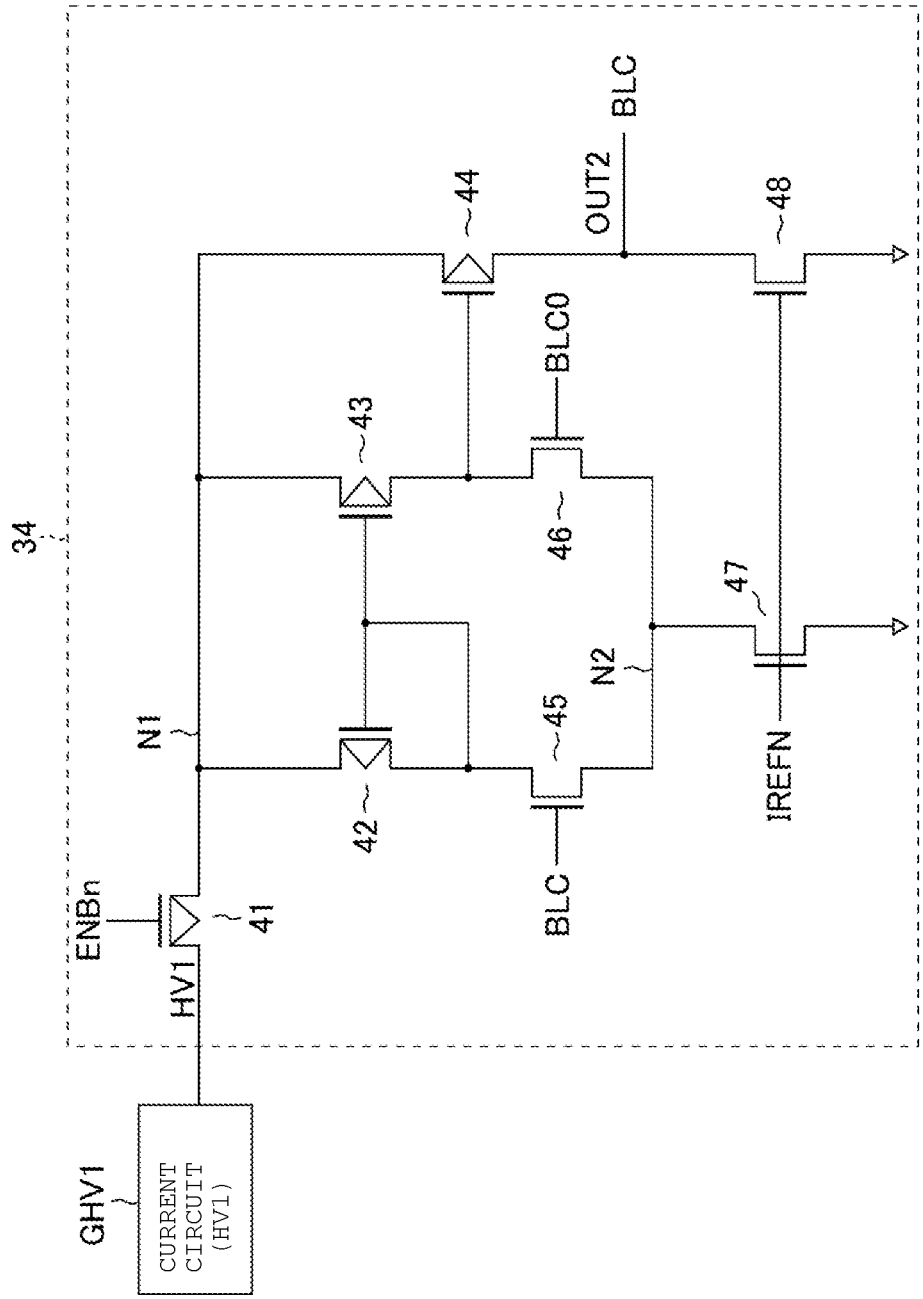
FIG. 6 is a circuit diagram of an amplifier circuit of the first embodiment.

FIG. 6 is an exemplary circuit diagram of the amplifier circuit 34 of the first embodiment. As shown in FIG. 6, the amplifier circuit 34 includes p-type MOSFETs 41, 42, 43, and 44, and n-type MOSFETs 45, 46, 47, and 48.

A first end of the transistor 41 receives the power source voltage HV1. For example, the first end of the transistor 41 can receive the power source voltage HV1 from the power supply circuit GHV1. A second end of the transistor 41 is connected to a node N1. For example, the transistor 41 receives a signal ENBn from the sequencer 13. The signal ENBn has an inverted logic of the enable signal ENB and is asserted during a required period while the amplifier circuit 34 is enabled.

The node N1 is connected to a first end of the transistor 42. The second end of the transistor 42 is connected to a gate of the transistor 42, and connected to a first end of the transistor 45. A gate of the transistor is connected to the node BLC. A second end of the transistor 45 is connected to a node N2.

Also, the node N1 is connected to a first end of the transistor 43. A gate of the transistor 43 is connected to a gate of the transistor 42, and the transistors 43 and 42 configure a current mirror circuit.

A second end of the transistor 43 is connected to a first end of the transistor 46. A gate of the transistor is connected to the node BLC0. A second end of the transistor 46 is connected to the node N2.

The node N2 is connected to the common voltage node via the transistor 47. For example, a gate of the transistor receives a signal IREFN from the sequencer 13. The signal IREFN is asserted to drive the transistors 47 and 48 while the amplifier circuit 34 is enabled.

Furthermore, the node N1 is connected to a first end of the transistor 44. A gate of the transistor 44 is connected to a node in which the transistor 43 and the transistor 46 are connected.

A second end of the transistor 44 functions as the output node OUT2 of the amplifier circuit 34, and is connected to the node BLC. The second end of the transistor is connected to the common voltage node via the transistor 48. A gate of the transistor 48 receives the signal IREFN.

The transistor 48 functions as a discharge path of flowing a current from the node N1 in the amplifier circuit 34 to the common voltage node via the transistor 44. Also, the transistor 48 has a function of causing the amplifier circuit 34 to discharge the current IBLC flowing from the current circuit 33 of FIG. 5 toward the common voltage node. Accordingly, the transistor 48 has a driving capability (size) capable of flowing a current of the amplifier circuit 34 and flowing the current IBLC.

Figure 7:
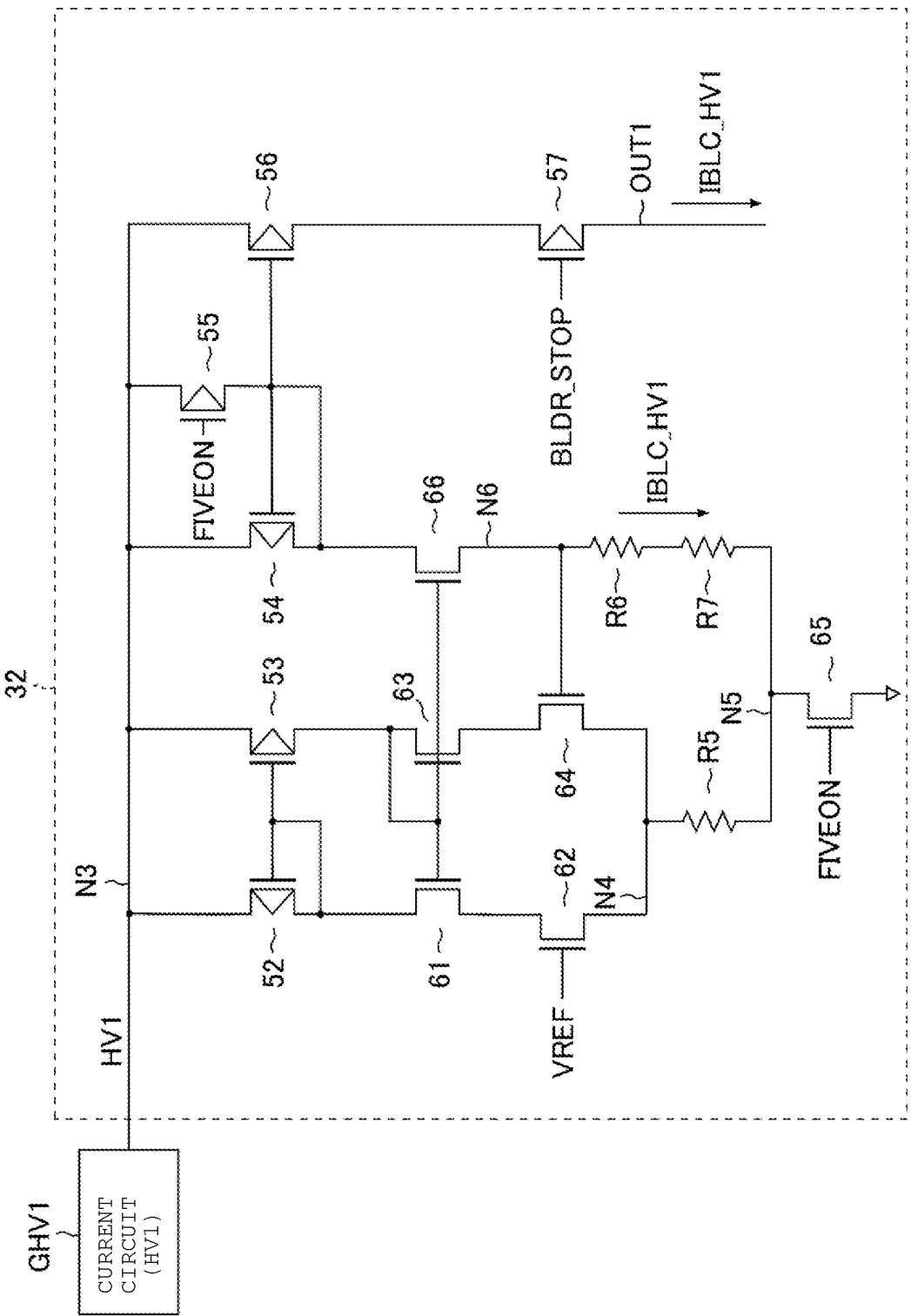
FIG. 7 is an exemplary circuit diagram of a current circuit of the first embodiment.

FIG. 7 is an exemplary circuit diagram of the current circuit 32 of the first embodiment. As shown in FIG. 7, the current circuit 32 includes p-type MOSFETs 52, 53, 54, 55, 56, and 57, n-type MOSFETs 61, 62, 63, 64, 65, and 66, and resistors R5, R6, and R7.

For example, the power source voltage HV1 supplied from the power supply circuit GHV1 is supplied to a node N3.

The node N3 is connected to a first end of the transistor 52. A second end of the transistor 52 is connected to a gate of the transistor 52, and connected to a first end of the transistor 61. A second end of the transistor 61 is connected to a node N4 via the transistor 62. A gate of the transistor 62 receives the reference voltage VREF.

Also, the node N3 is connected to a first end of the transistor 53. A gate of the transistor 53 is connected to a gate of the transistor 52, and the transistors 53 and 52 configure a current mirror circuit.

A second end of the transistor 53 is connected to a gate and a first end of the transistor 63. Furthermore, a gate of the transistor 63 is connected to a gate of the transistor 61, and the transistors 61 and 63 configure a current mirror circuit.

A second end of the transistor 63 is connected to the node N4 via the transistor 64.

The node N4 is connected to the node N5 via the resistor R5. The node N5 is connected to the common voltage node via the transistor 65. For example, a gate of the transistor 65 receives a signal FIVEON from the sequencer 13. For example, the signal FIVEON has a voltage of a magnitude capable of sufficiently turning on the transistor 65 during a required period while the current circuit 32 is enabled.

Furthermore, the node N3 is connected to a first end of the transistor 54. A second end of the transistor 54 is connected to a gate of the transistor 54, and connected to a first end of the transistor 66. A gate of the transistor 66 is connected to a gate of the transistor 63, and the transistors 66 and 63 configure a current mirror circuit.

A second end (node N6) of the transistor 66 is connected to a gate of the transistor 64, and connected to the node N5 via the resistors R6 and R7 connected to each other in series. When a state of the current circuit 32 and the magnitude (state of power supply circuit GHV1) of the power source voltage HV1 are stable, the current IBLC_HV1 flows from the node N5 to the node N6.

The resistor R6 is matched with the resistor R1, and the resistor R7 is matched with the resistor R2. That is, the resistor R6 is intended to have the same characteristics as the resistor R1, and configured with, for example, elements of the same or the substantially same layout and dimensions in a common manufacturing process. Characteristics of a resistor include a resistance value (or magnitude). Similarly, the resistor R7 is intended to have the same characteristics as the resistor R2, and configured with, for example, elements of the same or the substantially same layout and dimensions in a common manufacturing process. For this reason, even if characteristics (particularly, resistance values) of the resistors R1, R2, R6, and R7 of the semiconductor memory device 1 are different from the resistance values of the resistors R1, R2, R6, and R7 of another semiconductor memory device 1 due to variations in the manufacturing process or the like, the resistors R1 and R6 have the substantially same characteristics (particularly, resistance) (matched), and the resistors R2 and R7 have the substantially same characteristics (particularly, resistance) (matched) in each semiconductor memory device 1.

Also, the node N3 is connected to the gate of the transistor 54 via the transistor 55. A gate of the transistor 55 receives the signal FIVEON.

Furthermore, the node N3 is connected to a first end of the transistor 56. A gate of the transistor 56 is connected to the gate of the transistor 54, and the transistors 56 and 54 configure a current mirror circuit.

A second end of the transistor 56 is connected to a first end of the transistor 57. For example, a gate of the transistor 57 receives a signal BLDR_STOP from the sequencer 13. For example, a signal BLDR_STP is asserted to stop outputting of the current circuit 32. A second end of the transistor 57 functions as the output node OUT1 of the current circuit 32. That is, the current IBLC_HV1 flows through the second end of the transistor 57.

The magnitude of the current IBLC_HV1 flowing through the resistors R6 and R7 depends on the resistance of the resistors R6 and R7, and a current of the same or the substantially same magnitude as the magnitude of a current flowing from the node N6 to the node N5 via the resistors R6 and R7, flows out of the node OUT1.

Figure 8:
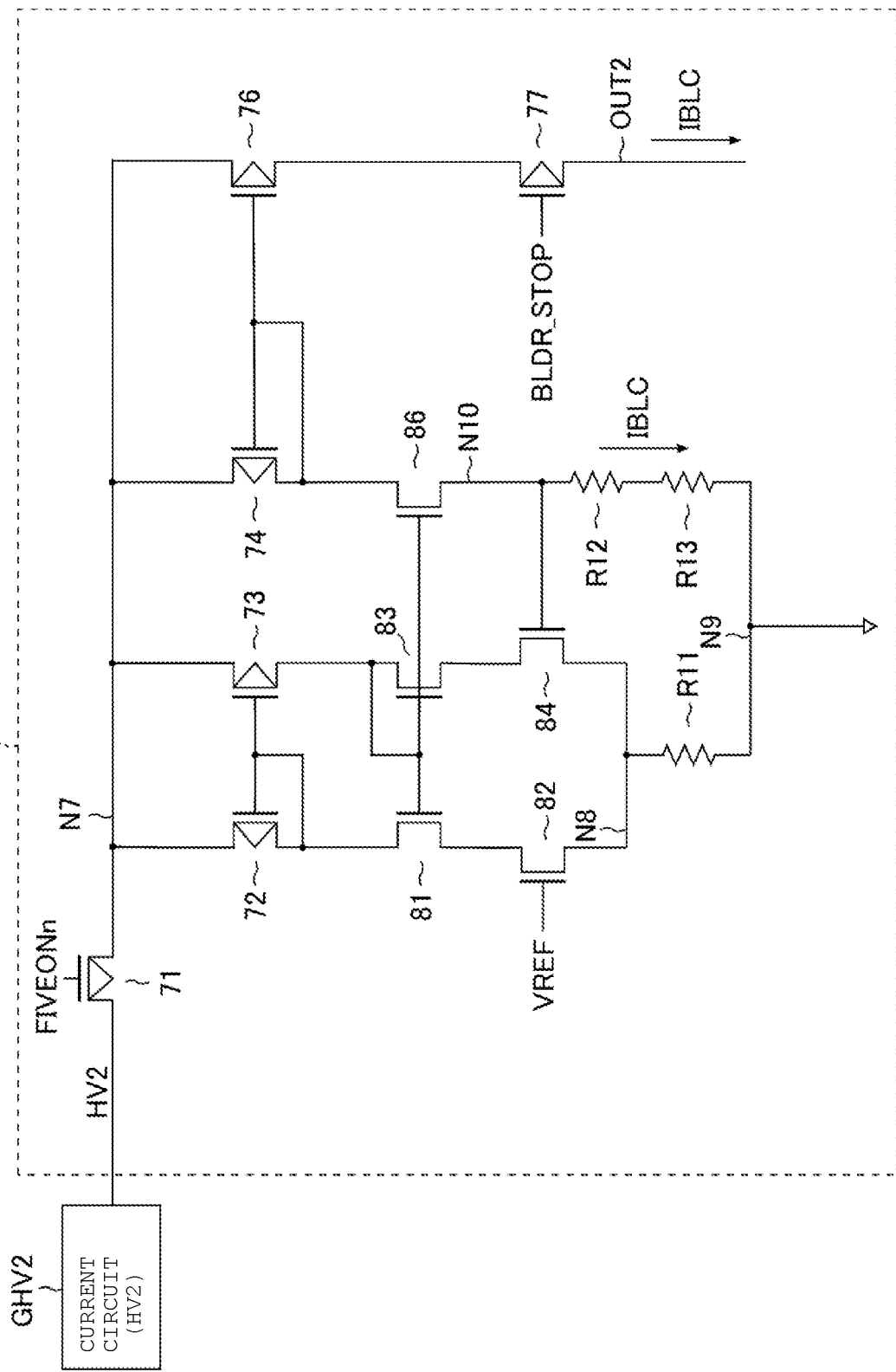
FIG. 8 is an exemplary circuit diagram of the current circuit of the first embodiment.

FIG. 8 is an exemplary circuit diagram of the current circuit 33 of the first embodiment. As shown in FIG. 8, the current circuit 32 includes p-type MOSFETs 71, 72, 73, 74, 76, and 77, n-type MOSFETs 81, 82, 83, 84, and 86, and the resistors R11, R12, and R13.

For example, a first end of the transistor 71 receives the power source voltage HV2 from the power supply circuit GHV2. A second end of the transistor 71 is connected to a node N7. For example, the transistor 71 receives a signal FIVEONn from the sequencer 13.

The node N7 is connected to a first end of the transistor 72. A second end of the transistor 72 is connected to a gate of the transistor 72, and connected to a first end of the transistor 81. A second end of the transistor 81 is connected to a node N8 via the transistor 82. A gate of the transistor 82 receives the reference voltage VREF.

Also, the node N7 is connected to a first end of the transistor 73. A gate of the transistor 73 is connected to a gate of the transistor 72, and the transistors 73 and 72 configure a current mirror circuit.

A second end of the transistor 73 is connected to a gate and a first end of the transistor 83. Furthermore, the gate of the transistor 83 is connected to a gate of the transistor 81, and the transistors 81 and 83 configure a current mirror circuit.

A second end of the transistor 83 is connected to the node N8 via the transistor 84.

The node N8 is connected to a node N9 via the resistors R11. The node N9 is connected to the common voltage node.

Furthermore, the node N7 is connected to a first end of the transistor 74. A second end of the transistor 74 is connected to a gate of the transistor 74, and connected to a first end of the transistor 86. A gate of the transistor 86 is connected to a gate of the transistor 83, and the transistors 86 and 83 configure a current mirror circuit.

A second end (node N10) of the transistor 86 is connected to a gate of the transistor 84, and connected to the node N9 via the resistors R12 and R13 connected to each other in series. When a state of the current circuit 33 and the magnitude (state of power supply circuit GHV2) of the power source voltage HV2 are stable, the current IBLC flows from the node N9 to the node N10.

The resistor R12 is matched with the resistor R3, and the resistor R13 is matched with the resistor R4. That is, the resistor R12 is intended to have the same characteristics (including resistance value) as the resistor R3, and configured with, for example, elements of the same or the substantially same layout and dimensions in a common manufacturing process. Characteristics of a resistor include a resistance value (or magnitude). Similarly, the resistor R13 is intended to have the same characteristics as the resistor R4, and configured with, for example, elements of the same or the substantially same layout and dimensions in a common manufacturing process. For this reason, even if characteristics (particularly, resistance values) of the resistors R3, R4, R12, and R13 of the semiconductor memory device 1 are different from the resistance values of the resistors R3, R4, R12, and R13 of another semiconductor memory device 1 due to variations in the manufacturing process or the like, the resistors R3 and R12 have the substantially same characteristics (particularly, resistance) (matched), and the resistors R4 and R13 have the substantially same characteristics (particularly, resistance) (matched) in each semiconductor memory device 1.

Furthermore, the node N7 is connected to a first end of the transistor 76. A gate of the transistor 76 is connected to a gate of the transistor 74, and the transistors 76 and 74 configure a current mirror circuit.

A second end of the transistor 76 is connected to a first end of the transistor 77. For example, a gate of the transistor 77 receives the signal BLDR STOP from the sequencer 13. A second end of the transistor 77 functions as the output node OUT2 of the current circuit 33. That is, the current IBLC flows through the second end of the transistor 77.

The magnitude of the current IBLC flowing through the resistors R12 and R13 depends on the resistance of the resistors R12 and R13, and a current of the same or the substantially same magnitude as the magnitude of a current flowing from the node N10 to the node N9 via the resistors R12 and R13, flows out of a node OUT2.

1.2. Operation 1.2.1. Operation of Current Circuit 32

The current circuit 32 of FIG. 7 is operated as below.

The signal FIVEON has a voltage capable of sufficiently turning on the transistor 65, and the signal BLDR_STOP has a voltage capable of sufficiently turning on the transistor 57. In this state, for example, the power source voltage HV1 rises from the internal power source voltage VCC to a target voltage HV1T. The magnitude of the power source voltage HV1 starts to rise by enabling an element (for example, power supply circuit GHV1) of generating the power source voltage HV1 by requiring the application of voltages VBLC, VBLX, and VXXL.

As the magnitude of power source voltage HV1 rises, the magnitude of current IBLC_HV1 of the output node OUT1 also rises. When the magnitude of the power source voltage HV1 is stabilized, that is, when the magnitude is in a steady state, the magnitude of the current IBLC_HV1 becomes the magnitude of the steady state. The magnitude of the current IBLC_HV1 in the steady state is determined as below.

A voltage of a magnitude based on the current IBLC_HV1 and the combined resistance of the resistors R6 and R7, is generated at the node N6 by the current IBLC_HV1. A voltage of the node N6 is compared with the reference voltage VREF, and the magnitude of the current IBLC_HV1 is determined by the difference between the voltage of the node N6 and the reference voltage VREF. For this reason, the magnitude of the current IBLC_HV1 is set to the magnitude determined by the resistors R6 and R7 and the reference voltage VREF. Therefore, a current obtained by mirroring the current IBLC_HV1 flowing through resistors R6 and R7, that is, a current having the substantially same magnitude as the current IBLC_HV1 flowing through the resistors R6 and R7 is output from the output node OUT1. Accordingly, the current IBLC_HV1 of the current circuit 32 has a magnitude determined based on the resistors R6 and R7.

As described with reference to FIG. 5, the current IBLC_HV1 influences the magnitude of the voltage VBLC0. In addition, the magnitude of the voltage VBLC0 also depends on the resistors R1 and R2. There is a possibility that the size of the resistors R1 and R2 deviate from the intended size due to variations in the manufacturing process. In a case where there is a deviation from the intended magnitude, when the current IBLC_HV1 has a constant magnitude produced from a constant current source, the magnitude of the voltage VBLC0 deviates from the intended magnitude.

Meanwhile, as described above, the current IBLC_HV1 is determined by the voltage of the node N6 and the reference voltage VREF, and the voltage of the node N6 depends on the resistors R6 and R7. The resistors R1 and R2 are matched with the resistors R6 and R7, respectively. For this reason, if the combined resistance of the resistors R1 and R2 is smaller than the intended resistance by a first value, then the magnitude of the combined resistance of the resistors R6 and R7 is also smaller than the intended resistance by the first value. As a result, the magnitude of the voltage of the node N6 is smaller than the intended magnitude. This is fed back to the current circuit 32, and the current IBLC_HV1 flowing through the resistors R6 and R7 is greater than the standard magnitude by a second value based on the first value. As a result, the magnitude of the current IBLC_HV1 output from the output node OUT1 is also greater than the standard magnitude by the second value. Accordingly, even if the combined resistance of the resistors R1 and R2 is smaller than the intended resistance, the current IBLC_HV1 greater than the intended magnitude by a magnitude that compensates for this small amount, flows out of the current circuit 32. Accordingly, the small magnitude of the combined resistance of the resistors R1 and R2 is compensated by the increase in the current IBLC_HV1 and even though the combined resistance is smaller than the intended resistance, the voltage VBLC0 has the same or the substantially same magnitude as the intended magnitude.

Even if the combined resistance is greater than the intended resistance, a feedback mechanism compensates for the magnitude of the voltage VBLC0. Accordingly, even if the resistance of the resistor RA deviates from the intended resistance, the voltage VBLC0 having the same or the substantially same magnitude as the intended magnitude, is obtained.

1.2.2. Operation of Current Circuit 33

A current circuit 33 of FIG. 8 is operated as below.

The voltage of the signal FIVEONn is a voltage capable of sufficiently turning on the transistor 71, and the voltage of the signal BLDR STOP is a voltage capable of sufficiently turning on the transistor 77. In this state, for example, the power source voltage HV2 rises a target magnitude HV2T from the internal power source voltage VCC. The magnitude of the power source voltage HV2 starts to rise by enabling an element (for example, power supply circuit GHV2) of generating the power source voltage HV2 by requiring the application of the voltages VBLC, VBLX, and VXXL.

As the magnitude of the power source voltage HV2 rises, the magnitude of a current IBLC_HV2 of the output node OUT2 also rises. When the magnitude of the power source voltage HV2 is stabilized, that is, when the magnitude is in the steady state, the magnitude of the current IBLC_HV2 becomes the magnitude in the steady state. In the steady state, the magnitude of the current IBLC_HV2 is determined as below.

A voltage of a magnitude based on the current IBLC_HV2 and the combined resistance of the resistors R12 and R13 is generated by the current IBLC_HV2 at the node N10. A voltage of the node N10 is compared with the reference voltage VREF, and the magnitude of the current IBLC is determined by the difference between the voltage of the node N10 and the reference voltage VREF. For this reason, the magnitude of the current IBLC is set to a magnitude determined by the resistors R12 and R13 and the reference voltage VREF. Therefore, a current obtained by mirroring the current IBLC flowing through resistors R12 and R13, that is, a current having the substantially same magnitude as the current IBLC flowing through resistors R12 and R13, is output from the output node OUT2. Accordingly, the current IBLC of the current circuit 33 has a magnitude determined based on the resistors R12 and R13.

As described with reference to FIG. 5, the current IBLC influences the magnitude of the voltage VBLX0 and the magnitude of the voltage VXXL0. In addition, the magnitude of the voltage VBLX0 also depends on the resistance of the resistor R4 and the magnitude of the voltage VXXL0 depends on the combined resistance of the resistors R3 and R4. There is a possibility that the combined resistance of the resistors R3 and R4 deviates from the intended resistance due to variations in the manufacturing process. In a case where there is a deviation from the intended resistance, when the current IBLC has a constant magnitude produced from a constant current source, the magnitudes of the voltages VBLX0 and VXXL0 deviate from the intended magnitude.

Meanwhile, as described above, the current IBLC is determined by the voltage of the node N10 and the reference voltage VREF, and the voltage of the node N10 depends on the combined resistance of the resistors R12 and R13. The resistors R3 and R4 are matched with the resistors R12 and R13, respectively. For this reason, if the combined resistance of the resistors R3 and R4 (or the resistance of resistor R4) is smaller than the intended resistance by the first value (or the second value), then the magnitude of the combined resistance of the resistors R12 and R13 (or the resistance of the resistor R13) is also smaller than the intended resistance by the first value (or the second value). As a result, the magnitude of the voltage of the node N10 is smaller than the intended magnitude. This is fed back to the current circuit 33, and the current IBLC flowing through the resistors R12 and R13 becomes greater than the standard magnitude by a third value based on the first value (or the second value). As a result, the magnitude of the current IBLC output from the output node OUT2 is greater than the standard magnitude by the third value. Accordingly, even if the combined resistance of the resistors R3 and R4 (or the resistance of the resistor R4) is smaller than the intended resistance, the current IBLC greater than the intended magnitude by a magnitude that compensates for this smaller amount, flows out of the current circuit 33. Accordingly, the small combined resistance of the resistors R3 and R4 (or the small resistance of the resistor R4) is compensated by the increase of the current IBLC, and even though the combined resistance of the resistors R3 and R4 (or the resistance of the resistor R4) is smaller than the intended resistance, the voltages VBLX0 and VXXL0 (or VXXL0) have the same or the substantially same magnitude as the intended magnitude.

Even if the combined resistance of the resistors R3 and R4 (or the resistance of the resistor R4) is greater than the intended magnitude, a feedback mechanism compensates for the magnitudes of the voltages VBLX0 and VXXL0. Accordingly, even if the combined resistance of the resistors R3 and R4 (or the resistance of the resistor R4) deviates from the intended resistance, the voltages VBLX0 and VXXL0 having the same or the substantially same magnitude as the intended magnitude, are obtained.

1.2.3. Operation of Sense Amplifier Circuit

Figure 9:
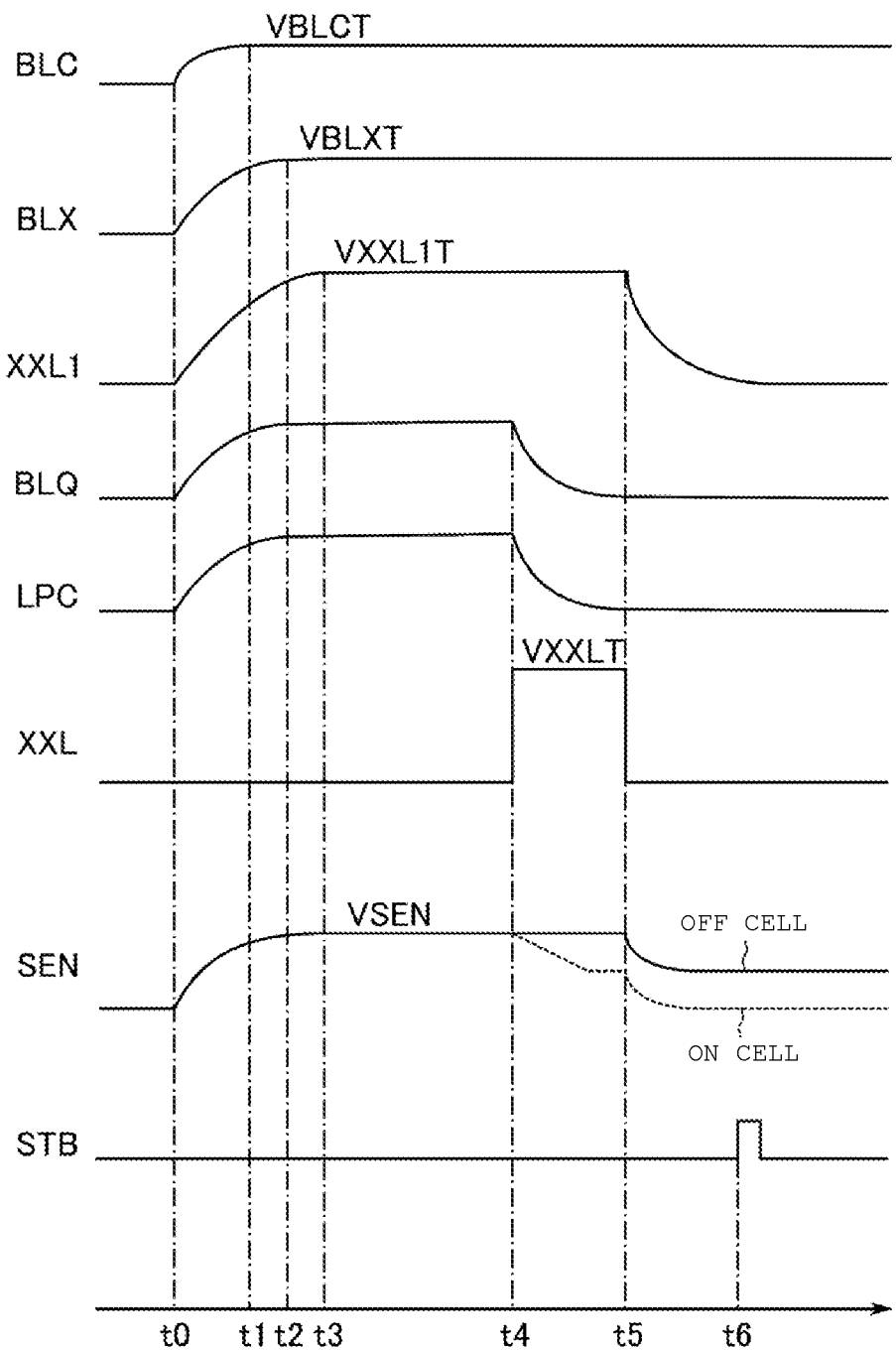
FIG. 9 shows the voltages at several nodes during an operation in the semiconductor memory device of the first embodiment.

With reference to FIG. 4 and FIG. 9, a sense amplifier circuit SAC operation will be described.

FIG. 9 shows some node voltages during an operation in the semiconductor memory device 1 of the first embodiment. More specifically, FIG. 9 shows transition based on a time of some voltages and signals of the sense amplifier circuit SAC during the reading of data from the memory cell array 11.

During the reading, the node INV has a voltage based on data stored in the data latch circuit LC connected to the sense amplifier circuit SAC. In the following description, as an example, it is assumed that the voltage of the node INV is at a digital low level, and the transistor 22 is turned on. In addition, at a time t0, the control signal XXL ENB is negated and the node XXL has 0V (=VSS).

As shown in FIG. 9, from the time t0, the nodes BLC, BLX, and XXL1 start to rise. The voltage (VBLC) of the node BLC is generated by the current circuit 32 and the amplifier circuit 34 in the voltage generation circuit 14, the current circuit 32 generates the voltage VBLC by using the power source voltage HV1, and the power supply circuit GHV1 that generates the power source voltage HV1, is enabled from the time t0. For this reason, the voltage of the node BLC starts to rise from the time t0.

In addition, the voltage (VBLX) of the node BLX is based on the voltage VBLX0, the voltage VBLX0 is generated by using the voltage VBLC and the current IBLC, the current IBLC is generated by using the power source voltage HV2, and the power supply circuit GHV2 that generates the power source voltage HV2, is enabled from the time t0. For this reason, the voltage of the node BLX starts to rise from the time t0.

Similarly, the voltage (VXXL1) of the node XXL1 is based on the voltage VXXL0, the voltage VXXL0 is generated by using the voltage VBLC and the current IBLC, the current IBLC is generated by using the power source voltage HV2, and the power supply circuit GHV2 that generates the power source voltage HV2 is enabled from the time t0. For this reason, the voltage of the node XXL1 starts to rise from the time t0.

Although not shown, the voltage (VBLS) of the node BLS also starts to rise from the time t0. The node BLS rapidly reaches a target voltage from the time t0. As a result, the node BLI is connected to a corresponding bit line BL via the transistor Tbls.

By the rising of the voltage of the node BLC from the time t0, the transistor Tblc is turned on at a certain timing, and the node BLI is connected to the node SCOM. In addition, by the rising of the voltage of the node BLX from the time t0, the transistor Tblx is turned on at a certain timing, the node SCOM is connected to the node SSRC, and charging of the node SCOM starts.

In addition, the voltage (VBLQ) of the node BLQ and the signal LPC rise from the time t0. As a result, charging of the node SEN starts via the data bus LBUS and the transistor Tblq, and then a voltage VSEN is obtained.

Since the power source voltage HV1 used to generate the voltage of the node BLC is smaller than power source voltage HV2, the power source voltage HV1 is stabilized (i.e., reaches target magnitude) at a relatively early timing. For this reason, the node BLC has a target voltage VBLCT at a time t1, which is a relatively early timing.

By the node BLC having a target voltage VBLCT at the time t1, the transistor Tblc is sufficiently turned on and the voltage of the node BLI can be transmitted to the node SCOM.

The power source voltage HV2 used to generate the voltage of the node BLX continues to rise from the time t0. According to this, the voltage of the node BLX continues to rise at the time t0, and when a state of the power source voltage HV2 is stabilized (i.e., reaches target magnitude), the voltage of the node BLX is at a target voltage VBLXT at a time t2 and thereafter. The voltage VBLXT is higher than the voltage VBLCT. Because the node BLX has a target voltage VBLXT, the transistor Tblx is sufficiently turned on and the voltage of the node SSRC can be transmitted to the node SCOM.

The power source voltage HV2 used to generate the voltage of the node XXL1 continues to rise from the time t0. According to this, the voltage of the node XXL1 continues to rise from the time t0. At a time t3 after the power source voltage HV2 is stabilized, the node XXL1 has a target voltage VXXL1T. The voltage VXXL1T is higher than the voltage VBLXT. The voltage VXXL1T has a magnitude capable of transmitting the voltage of the node SCOM to the node SEN by turning sufficiently on the transistor Txxl.

Then, a read voltage VCGR is applied to a selected word line WL connected to the cell unit CU, which is a read target, and a voltage corresponding to a state of the selected memory cell transistor MT of the read target appears on the node SCOM.

Next, at a time t4, by setting the voltage of the node BLQ and the signal LPC to the voltage VSS, charging of the node SEN is terminated. Furthermore, at the time t4, by asserting a signal XXL_ENB (not shown), the voltage on the node XXL1 is transmitted to the node XXL and the node XXL has a voltage VXXLT. As a result, the transistor Txxl is sufficiently turned on, the voltage of the node SCOM is transmitted to the node SEN, and the voltage of the node SEN is changed. If the turning off of the selected memory cell transistor MT is maintained by applying the read voltage VCGR, the voltage of the node SEN is maintained, and if the selected memory cell transistor MT is turned on, the voltage of the node SEN falls. A case where the selected memory cell transistor MT of the node SEN is turned off, is shown by a solid line ("off cell"), and a case where the selected memory cell transistor MT is turned on, is shown by a broken line ("on cell").

Sense is performed from a time t5. That is, at the time t5, by negating the signal XXL_ENB, the transistor Txxl is turned off. As a result, the node SEN is separated from the node SCOM. Even after separation, the node SEN maintains a voltage according to a state of the corresponding selected memory cell transistor MT.

For example, at a time t6, the signal STB becomes a high level by the sequencer 13 such that digital 0 or 1 appears on the data bus LBUS according to a voltage of the node SEN and reading is terminated.

1.2.4. Operation of Voltage Generation Circuit

Figure 10:
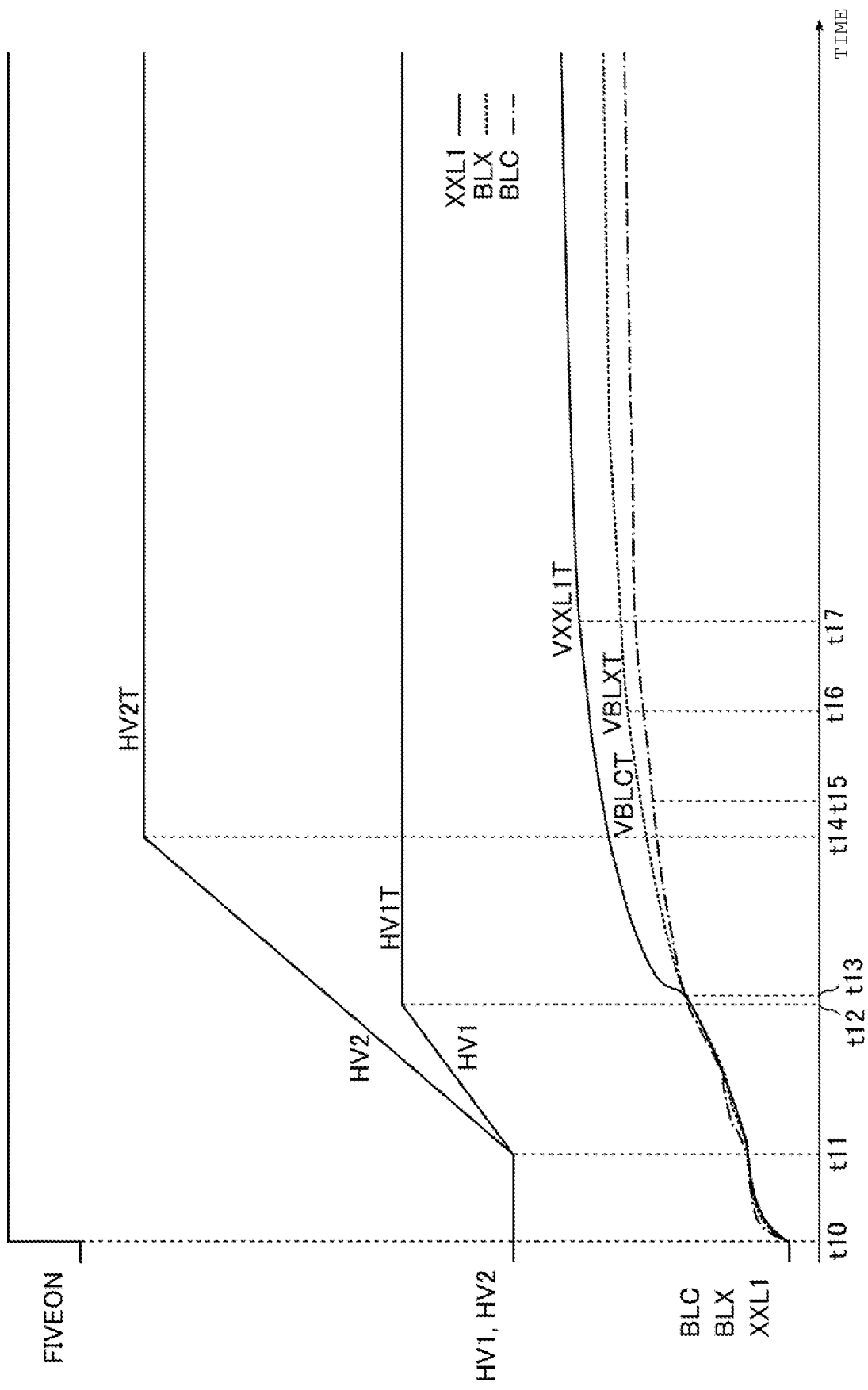
FIG. 10 shows the voltages at several nodes of the voltage generation circuit of the first embodiment along with time.

FIG. 10 shows the voltages of some nodes in the voltage generation circuit of the first embodiment along with time.

As shown in FIG. 10, at a time t10, the signal FIVEON becomes a high level. With this, the current circuits 32 and 33 are enabled and an operation starts.

At the time t10, the magnitudes of the power source voltages HV1 and HV2 do not start to rise. However, in a case where the current circuit 32 includes only a transistor of breakdown voltage or the like, when the current circuit 32 is enabled, an operation starts before the rising of the magnitude of the power source voltage HV1. FIG. 10 shows such a case as an example. For this reason, the magnitude of the current IBLC_HV1 rises at the time t10, and the voltage of the node BLC (VBLC) starts to rise along with this. Since the voltage of the node BLX (VBLX) and the voltage of the node XXL1 (VXXL1) are based on the voltage of the node BLC, the voltage of the node BLX and the voltage of the node XXL1 also start to rise along with the rising of the voltage of the node BLC.

The voltage of the node BLX is based on the voltage of the node BLX0, and the node BLX0 has a magnitude obtained by adding the voltage of a magnitude equal to a magnitude voltage difference of both ends of the resistor R4 to the voltage of the node BLC. For this reason, the node BLX has a voltage higher than the voltage of the node BLC. In addition, the voltage of the node XXL1 is based on the voltage of the node XXL0, and the node XXL1 has a magnitude obtained by adding the voltage of a magnitude equal to a magnitude voltage difference of both ends of a series connection structure of the resistors R3 and R4 to the voltage of the node BLC. For this reason, the node XXL1 has a voltage higher than the voltage of the node BLC. However, a time period may be set in which the voltage of the node BLC<the voltage of the node BLX<the voltage of the node XXL1 is not established, particularly, before the voltage is stabilized due to the influence of noise.

An operation of the voltage generation circuit 14 is not limited to the example of FIG. 10, and there is a case where the nodes BLC, BLX, and XXL1 start to rise based on the rising of the magnitude of the power source voltage HV1 which will be described below.

From a time t11, the magnitudes of the power source voltages HV1 and HV2 start to rise. Along with this, the magnitudes of the currents IBLC and IBLC_HV1 (not shown) rise at the time t11 by an operation of the current circuits 32 and 33.

Since the current circuit 32 requires the power source voltage HV1 lower than the power source voltage HV2 at an operation in a stable state, even if the power source voltage HV1 is lower than the power source voltage HV2, the current circuit 32 approaches a stable state earlier than the current circuit 33 using the power source voltage HV2. For this reason, the rising of the current IBLC_HV1 by the current circuit 32 starts earlier than the rising of the current IBLC by the current circuit 33.

Meanwhile, since the current circuit 33 is designed to perform a stable operation at the power source voltage HV2 higher than the power source voltage HV1, the current IBLC does not yet rise so much.

Along with the rising of the magnitude of the current IBLC_HV1, the voltage of the node BLC starts to rise from the time tn. Since the voltage of the node BLX and the voltage of the node XXL1 are based on the voltage of the node BLC, the voltage of the node BLX and the voltage of the node XXL1 also rise while a value of the current IBLC is small because the magnitude of the power source voltage HV2 is not so high. That is, from the time t11, the voltage of the node BLX and the voltage of the node XXL1 also start to rise.

At a time t12, the power source voltage HV1 becomes a target voltage HV1T.

In addition, when the magnitude of the power source voltage HV2 continuing to rise from the time t11 reaches a magnitude of a certain level, the current IBLC also reaches a certain magnitude, and the voltage of the node BLX and the voltage of the node XXL1 increase to rise. In the example of FIG. 10, the increase of a rising slope of the voltage of the node BLX and the voltage of the node XXL1 starts at a time t13 near the time t12.

At a time t14, the power source voltage HV2 becomes a target voltage HV2T.

After the time t13, the nodes BLC, BLX, and XXL1 have target voltages VBLCT, VBLXT, and VXXL1T, respectively. For example, the nodes BLC, BLX, and XXL1 have the target voltages VBLCT, VBLXT, and VXXLT at times t15, t16, and t17, respectively.

1.3. Effect

According to the first embodiment, it is possible for the nodes BLC, BLX, and XXL1 to reach the target voltages VBLCT, VBLXT, and VXXL0T in a shorter time.

Figure 11:
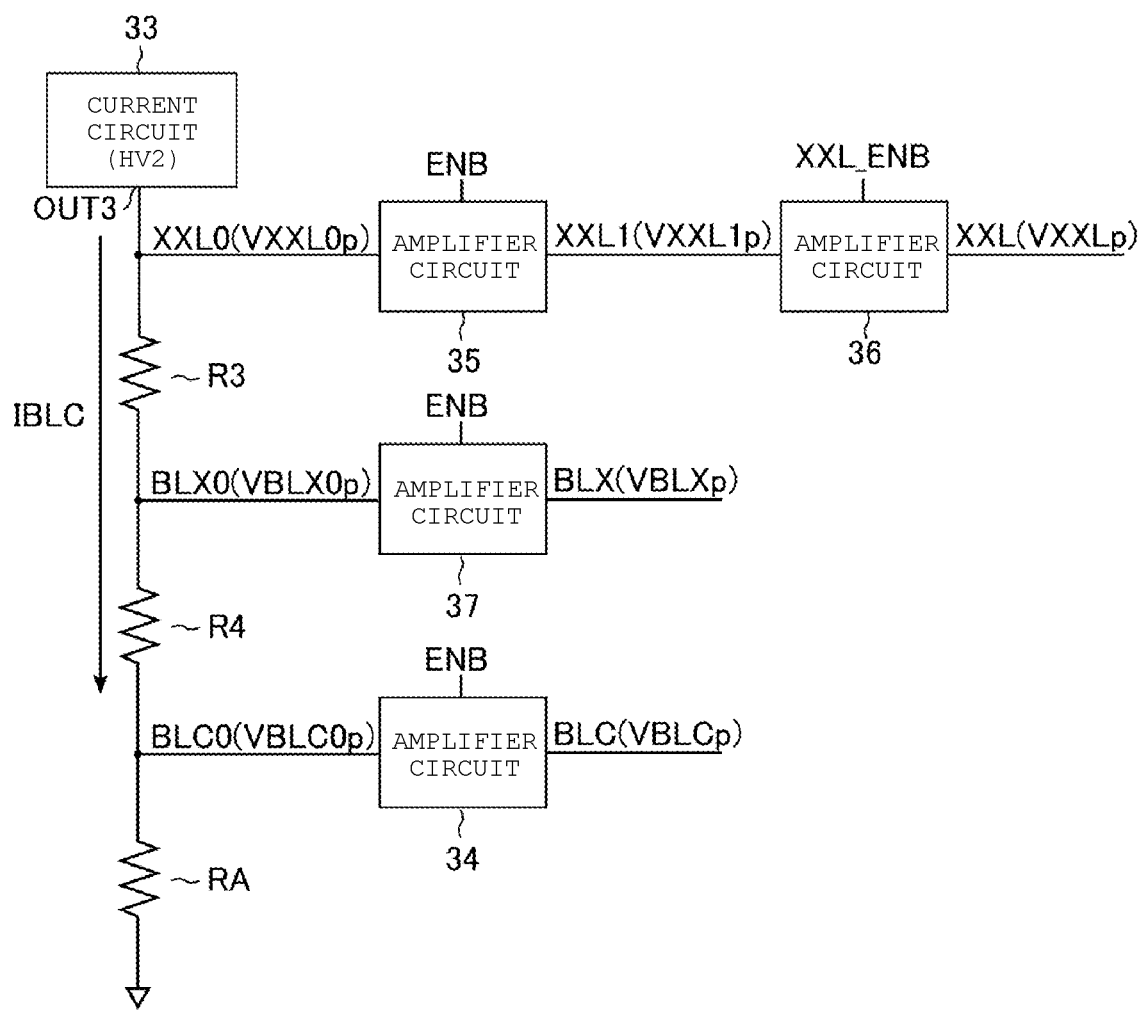
FIG. 11 is a circuit diagram of a reference voltage generation circuit.

It is considered that the voltages on the nodes BLC, BLX, and XXL1 are generated by the voltage generation circuit shown in FIG. 11. FIG. 11 is a circuit diagram of a reference voltage generation circuit 91. As shown in FIG. 11, all of the voltages VBLC0P, VBLX0P, and VXXL0P on each of the node BLC0, BLX0, and XXL0 are generated from the current IBLC and resistors. The voltage of the node BLC0 is generated from the current IBLC and the resistor RA, the voltage of the node BLX0 is generated from the current IBLC and the combined resistance of the resistors R4 and RA, and the voltage of the node XXL0 is generated from the current IBLC and the combined resistance of the resistors R3, R4, and RA.

Figure 12:
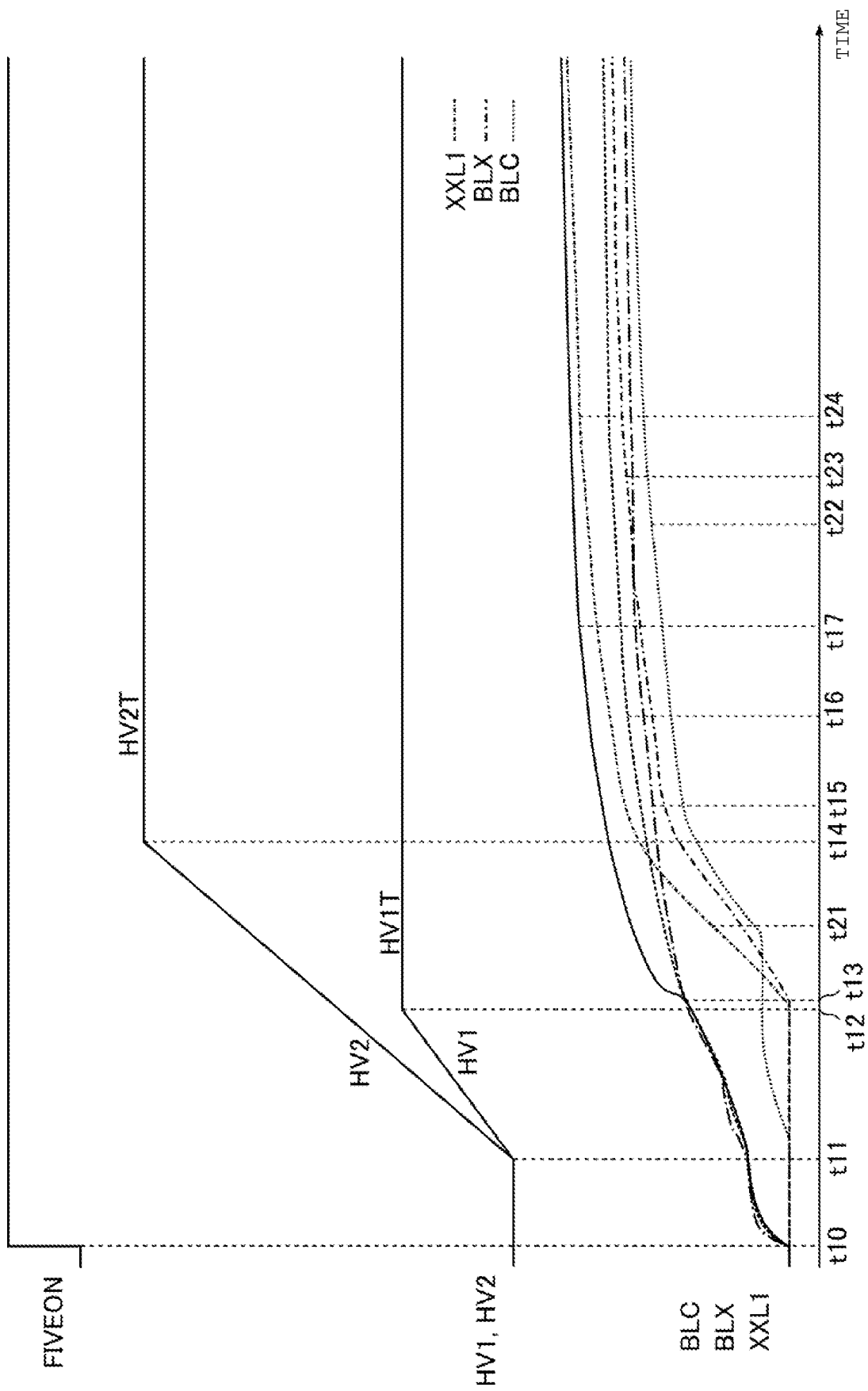
FIG. 12 shows voltages at several nodes of the reference voltage generation circuit along with time.

FIG. 12 shows some node voltages in the reference voltage generation circuit 91 of FIG. 11 along with time. In addition, FIG. 12 also shows the voltages of the nodes BLC, BLX, and XXL1 of FIG. 10 of the first embodiment.

As shown in FIG. 12, the voltage of the node BLC, the voltage of the node BLX, and the voltage of the node XXL1 start to rise at an initial time where the magnitude of the power source voltage HV2 becomes a magnitude of a certain level. In an example of FIG. 12, the rising starts around time a time t21 after the time t12.

As described above, since the nodes BLX and XXL1 and, particularly, the node XXL1 need to have a high voltage, the nodes BLX and XXL1 may be generated by using the current circuit 33 using the power source voltage HV2. However, since the power source voltage HV2 is high, it takes time to stabilize. This delays the start of the rising of the voltages of the nodes BLC, BLX, and XXL1. In the example of FIG. 12, for example, the nodes BLC, BLX, and XXL1 have the target voltages VBLCT, VBLXT, and VXXL1T at times t22, t23, and t24, respectively.

Here, the node BLX and the node XXL1 need to have the target voltages VBLXT and VXXL1T. As can be seen from FIG. 9, this is because each node is stable at the times t2 and t4, that is, after the elapse of time from the start of reading. Accordingly, even if the stability is delayed, since the voltage of the node BLX and the voltage of the node XXL1 do not have a problem in an initial operation, an overall operation time required for reading is not greatly affected. Meanwhile, the voltage of the node BLC affects a start time of the charge of the bit lines BL, and the start of the charge of the bit lines is necessary early in the reading. For this reason, when a time required for reaching a state where the node BLC have the voltage VBLCT is long, the time required for the reading is also long.

According to the first embodiment, since the voltage VBLC is generated by using the current IBLC_HV1 from the current circuit 32 and the current IBLC_HV1 is generated by using the power source voltage HV1 lower than the power source voltage HV2, even if the magnitude of the power source voltage HV1 does not rise so much, the voltage VBLC starts to rise. This can be visually understood from FIG. 12. Since the nodes BLX and XXL1 are used based on the voltage of the node BLC and the magnitude of the power source voltage HV2 does not rise, the nodes BLX and XXL1 also start to rise before the magnitude of the current IBLC starts to rise. For this reason, it is possible for the nodes BLC, BLX, and XXL1 to reach a state where the nodes have early the target voltages VBLCT, VBLXT, and VXXL1T as compared to a case where the reference voltage generation circuit 91 is used. That is, times t15, t16, and 17 at which the nodes BLC, BLX, and XXL1 have the target voltages VBLCT, VBLXT, and VXXL1T according to the first embodiment, reach earlier than times t22, t23, and t24, respectively, corresponding to a case where the reference voltage generation circuit 91 is used.

Particularly, the fact that the voltage of the node BLC starts to rise early from the start of reading can enable early the start of the charge of the bit lines BL and a reading time can be completed in a short time. According to the first embodiment, it is possible to complete reading in a time shorter than that of a case where the reference voltage generation circuit 91 is used.

In addition, in the sense amplifier circuit SAC, as can be seen from FIG. 4, the transistor Tblx presents in an upstream side (node VDD side) of the transistor Tblc in a path of charging from the node VDD to the bit lines BL. In order to charge the bit lines BL, the voltage VBLX supplied to a gate of the transistor Tblx needs to be higher than the voltage VBLC supplied to a gate of the transistor Tblc presenting in a downstream side (bit lines BL side) thereof. As can be seen FIG. 5, in the voltage generation circuit 14 of the first embodiment, the node BLX0 (node BLX) presents in an upstream side of the node BLC in a path of the current IBLC. Therefore, even if the voltage VBLC and the voltage VBLX are in a stage before they become stable in an initial read operation, the relationship voltage VBLX>voltage VBLC, is satisfied. For this reason, the charging of the bit lines BL in an initial stage of the start of reading, can be performed early.

Furthermore, although the two independent current circuits 32 and 33 are used in the generation of the nodes BLC, BLX, and XXL1, the current circuits 32 and 33 generate the currents IBLC_HV1 and IBLC by using a common reference voltage VREF. For this reason, the currents IBLC_HV1 and IBLC are prevented from having different magnitudes. In addition, since the voltages of the nodes BLX0 and XXL0 are generated based on the voltage of the node BLC, deviations from the target voltages VBLCT, VBLXT, and VXXL1T of respective nodes BLC, BLX, and XXL1 are substantially aligned. That is, the voltages of the nodes BLC, BLX, and XXL1 can be generated accurately. This prevents the occurrence of an abnormal operation in a sense amplifier circuit SA due to the deviation from the target voltages VBLCT, VBLXT and VXXL1T of the nodes BLC, BLX and XXL1, respectively.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
  a first current circuit configured to output a first current to a first node using a first voltage supplied thereto;
  a first resistor connected to the first node;
  a second resistor having a first end connected to a second node that is at a same voltage level as the first node and a second end;
  a second current circuit configured to output a second current to a third node using a second voltage, which is higher than the first voltage, supplied thereto; and
  a third resistor connected between the second end of the second resistor and the third node, wherein
  the first current circuit is configured to receive a reference voltage, and to output the first current based on a comparison with the reference voltage, and
  the second current circuit is configured to receive the reference voltage, and to output the second current based on a comparison with the reference voltage.

2. The semiconductor device according to claim 1, wherein the first voltage and the second voltage are generated from a power source voltage that is lower than the first voltage.

3. The semiconductor device according to claim 1, wherein
  the first current circuit outputs the first current by comparing the reference voltage with a voltage at a first internal node that is substantially equal to a voltage of the first node, and
  the second current circuit outputs the second current by comparing the reference voltage with a voltage at a second internal node that is substantially equal to a voltage of the second node.

4. The semiconductor device according to claim 3, wherein
  the first current circuit includes a fourth resistor that is matched with the first resistor, and is further configured to flow a third current through the first internal node and the fourth resistor based on the comparison of the reference voltage with the voltage at the first internal node, and the first current is a current obtained by mirroring the third current, and
  the second current circuit includes fifth and sixth resistors that are matched with the second and third resistors, respectively, and is further configured to flow a fourth current through the second internal node, the fifth resistor, and the sixth resistor, based on the comparison of the reference voltage and the voltage at the second internal node, and the second current is a current obtained by mirroring the fourth current.

5. The semiconductor device according to claim 1, further comprising:
  a first memory cell transistor;
  a first bit line connected to the first memory cell transistor via at least one transistor;
  a first transistor having a first end connected to the first bit line, a second end, and a gate connected to the second node;
  a second transistor having a first end connected to a second end of the first transistor, a second end connected to one of a power supply node and a ground node, and a gate connected to the second end of the second resistor; and
  a third transistor having a first end connected to the second end of the first transistor, a second end connected to a sense node, and a gate connected to the third node.

6. The semiconductor device according to claim 5, further comprising:
  a fourth transistor having a first end connected to a clock, a second end, and a gate connected to the sense node;
  a latch circuit; and
  a fifth transistor between the second end of the fourth transistor and the latch circuit.

7. The semiconductor device according to claim 1, wherein the first node and the second node are directly connected along a conductive line.

8. The semiconductor device according to claim 1, further comprising:
  an amplifier circuit between the first node and the second node, that is configured to output a voltage to the second node that is equal to a voltage input thereto from the first node.

9. A semiconductor device comprising:
  a first memory cell transistor;
  a first bit line connected to the first memory cell transistor via at least one transistor;

a voltage generation circuit including
a first current circuit configured to output a first current to a first node using a first voltage supplied thereto,
a first resistor connected to the first node,
a second resistor having a first end connected to a second node that is at a same voltage level as the first node and a second end,
a second current circuit configured to output a second current to a third node using a second voltage, which is higher than the first voltage, supplied thereto, and
a third resistor connected between the second end of the second resistor and the third node; and
a sense amplifier circuit including
a first transistor having a first end connected to the first bit line, a second end, and a gate connected to the second node,
a second transistor having a first end connected to a second end of the first transistor, a second end connected to one of a power supply node and a ground node, and a gate connected to the second end of the second resistor,
a third transistor having a first end connected to the second end of the first transistor, a second end connected to a sense node, and a gate connected to the third node,
a fourth transistor having a first end connected to a clock, a second end, and a gate connected to the sense node,
a latch circuit, and
a fifth transistor between the second end of the fourth transistor and the latch circuit, wherein
the first current circuit is configured to receive a reference voltage, and to output the first current based on a comparison with the reference voltage, and
the second current circuit is configured to receive the reference voltage, and to output the second current based on a comparison with the reference voltage.

10. The semiconductor device according to claim 9, wherein the first voltage and the second voltage are generated from a voltage at the power supply node that is lower than the first voltage.

11. The semiconductor device according to claim 9, wherein
the first current circuit outputs the first current by comparing the reference voltage with a voltage at a first internal node that is substantially equal to a voltage of the first node, and
the second current circuit outputs the second current by comparing the reference voltage with a voltage at a second internal node that is substantially equal to a voltage of the second node.

12. The semiconductor device according to claim 11, wherein
the first current circuit includes a fourth resistor that is matched with the first resistor, and is further configured to flow a third current through the first internal node and the fourth resistor based on the comparison of the reference voltage with the voltage at the first internal node, and the first current is a current obtained by mirroring the third current, and
the second current circuit includes fifth and sixth resistors that are matched with the second and third resistors, respectively, and is further configured to flow a fourth current through the second internal node, the fifth resistor, and the sixth resistor, based on the comparison of the reference voltage and the voltage at the second internal node, and the second current is a current obtained by mirroring the fourth current.

13. A method of charging a bit line in preparation for a sense operation in a semiconductor device that comprises
a first memory cell transistor connected to the bit line via at least one transistor,
a voltage generation circuit including
a first current circuit configured to output a first current to a first node using a first voltage supplied thereto,
a first resistor connected to the first node,
a second resistor having a first end connected to the first node and a second end,
a second current circuit configured to output a second current to a second node using a second voltage, which is higher than the first voltage, supplied thereto,
a third resistor connected between the second end of the second resistor and the second node, and
an amplifier circuit between the second node and a third node, that is configured to output a voltage to the third node that is equal to a voltage supplied thereto from the second node when the amplifier circuit is in an enabled state,
a sense amplifier circuit including
a first transistor having a first end connected to the first bit line, a second end, and a gate connected to the first node,
a second transistor having a first end connected to a second end of the first transistor, a second end connected to one of a power supply node and a ground node, and a gate connected to the second end of the second resistor, and
a third transistor having a first end connected to the second end of the first transistor, a second end connected to a sense node, and a gate connected to the third node,
said method comprising:
generating the first current in the first current circuit and outputting the first current to the first node to turn on the first transistor;
generating the second current in the second current circuit and outputting the second current to the second node to turn on the second transistor;
after the first and second transistors are turned on, enabling the amplifier circuit as a result of which the voltage of the third node becomes equal to the voltage of the second node and the third transistor is turned on;
supplying the first voltage and a power supply voltage that is lower than the first voltage to the first current circuit; and
supplying the second voltage and the power supply voltage to the second current circuit.

14. The method of claim 13, wherein the voltage at the first node is less than the voltage at the second node.

15. The method of claim 14, wherein the voltage applied to the gate of the second transistor to turn on the second transistor is greater than the voltage at the first node.

16. The method of claim 13, wherein
the first current circuit includes a fourth resistor that is matched with the first resistor, and
the second current circuit includes fifth and sixth resistors that are matched with the second and third resistors, respectively.

17. The method of claim 16, further comprising:
generating a third current flowing through the fourth resistor and a fourth current flowing through the fifth and sixth resistors; and
mirroring the third current to generate the first current and mirroring the fourth current to generate the second current.

* * * * *